(12) United States Patent
Kuriyama et al.

(10) Patent No.: US 11,545,700 B2
(45) Date of Patent: Jan. 3, 2023

(54) POWER STORAGE SYSTEM WITH INTEGRALLY FORMED VOLTAGE DETECTING FIELD EFFECT TRANSISTOR AND MANUFACTURING METHOD THEREOF

(71) Applicants: Hiromichi Kuriyama, Kanagawa (JP); Masami Takai, Tokyo (JP); Satoshi Nakajima, Tokyo (JP); Eiko Suzuki, Kanagawa (JP); Toru Ushirogochi, Kanagawa (JP)

(72) Inventors: Hiromichi Kuriyama, Kanagawa (JP); Masami Takai, Tokyo (JP); Satoshi Nakajima, Tokyo (JP); Eiko Suzuki, Kanagawa (JP); Toru Ushirogochi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 188 days.

(21) Appl. No.: 16/750,169

(22) Filed: Jan. 23, 2020

(65) Prior Publication Data
US 2020/0243915 A1   Jul. 30, 2020

(30) Foreign Application Priority Data

Jan. 25, 2019 (JP) .............................. JP2019-011676
Dec. 3, 2019 (JP) .............................. JP2019-218938

(51) Int. Cl.
*H01M 10/48* (2006.01)
*H01M 10/0585* (2010.01)
(Continued)

(52) U.S. Cl.
CPC .. *H01M 10/0585* (2013.01); *G01R 19/16542* (2013.01); *H01M 4/0407* (2013.01);
(Continued)

(58) Field of Classification Search
None
See application file for complete search history.

(56) References Cited

U.S. PATENT DOCUMENTS 6,163,190 A    12/2000  Takai et al.
6,246,272 B1    6/2001  Takai
(Continued)

FOREIGN PATENT DOCUMENTS

JP         5380831        1/2014
JP       2016-207540     12/2016
(Continued)

OTHER PUBLICATIONS muRata, "muRata Small Energy Device (UMA Series) Technical Notes", No. C2M1CXS-231D, Oct. 2017, with partial translation.
(Continued)

*Primary Examiner* — Lucas J. O'Donnell
(74) *Attorney, Agent, or Firm* — IPUSA, PLLC

(57) ABSTRACT

A power storage system includes a power storage element; and a voltage detecting unit configured to detect an output voltage of the power storage element. The power storage element and the voltage detecting unit are formed by integrally forming structural materials of the power storage element and the voltage detecting unit on the same base material, without any point bonding portions formed by solder mounting.

19 Claims, 14 Drawing Sheets

(51) Int. Cl.
  *H01M 10/42* (2006.01)
  *H01M 10/0525* (2010.01)
  *H01M 4/04* (2006.01)
  *H01M 4/139* (2010.01)
  *H01M 4/36* (2006.01)
  *G01R 19/165* (2006.01)
  *H01M 10/44* (2006.01)
  *H01M 10/0565* (2010.01)

(52) U.S. Cl.
  CPC .......... *H01M 4/139* (2013.01); *H01M 4/364* (2013.01); *H01M 10/0525* (2013.01); *H01M 10/0565* (2013.01); *H01M 10/425* (2013.01); *H01M 10/44* (2013.01); *H01M 10/48* (2013.01); *H01M 2010/4271* (2013.01)

(56) References Cited

U.S. PATENT DOCUMENTS

| | | | |
|---|---|---|---|
| 7,781,089 B2 * | 8/2010 | Tan | H01M 10/425 429/65 |
| 8,183,563 B2 | 5/2012 | Yutani et al. | |
| 9,111,684 B2 | 8/2015 | Onagi et al. | |
| 9,641,003 B2 | 5/2017 | Takai | |
| 9,742,205 B2 | 8/2017 | Takai | |
| 9,754,726 B2 | 9/2017 | Onagi et al. | |
| 9,831,521 B2 | 11/2017 | Kimura et al. | |
| 10,090,554 B2 | 10/2018 | Yanagita et al. | |
| 2009/0258295 A1 * | 10/2009 | Niessen | H01M 10/425 429/231.95 |
| 2013/0260183 A1 * | 10/2013 | Ellis-Monaghan | H01M 10/0525 429/7 |
| 2014/0186696 A1 | 7/2014 | Onagi et al. | |
| 2015/0303513 A1 | 10/2015 | Hirowatari et al. | |
| 2015/0323811 A1 * | 11/2015 | Flitsch | G02C 7/083 307/154 |
| 2015/0357837 A1 | 12/2015 | Takai et al. | |
| 2016/0149170 A1 * | 5/2016 | Asai | H01M 10/0525 29/623.5 |
| 2016/0260972 A1 | 9/2016 | Hibino et al. | |
| 2017/0317374 A1 * | 11/2017 | Takahashi | H01M 50/107 |
| 2018/0261827 A1 | 9/2018 | Yanagita et al. | |
| 2020/0295413 A1 * | 9/2020 | Yamazaki | G01K 1/14 |

FOREIGN PATENT DOCUMENTS

| | | |
|---|---|---|
| JP | 2019-061943 | 4/2019 |
| WO | 2018/164076 | 9/2018 |

OTHER PUBLICATIONS

S. Kobayashi et al., "Control of carrier density by self-assembled monolayers in organic field-effect transistors", nature materials, vol. May 3, 2004, pp. 317-322.

K. Hayasaka et al., "Compact Organic Complementary D-Type Flip-Flop Circuits Fabricated with Inkjet Printing", Adv. Electron. Mater, Mar. 2017, pp. 1-6.

H. Matsui et al., "Printed 5-V organic operational amplifiers for various signal processing", Scientific Reports, Jun. 2018, pp. 1-9.

* cited by examiner

POWER STORAGE SYSTEM WITH INTEGRALLY FORMED VOLTAGE DETECTING FIELD EFFECT TRANSISTOR AND MANUFACTURING METHOD THEREOF

CROSS-REFERENCE TO RELATED APPLICATION

The present application is based on and claims priority under 35 U.S.C. 5119 to Japanese Patent Application No. 2019-011676, filed on Jan. 25, 2019, and Japanese Patent Application No. 2019-218938, filed on Dec. 3, 2019, the contents of which are incorporated herein by reference in their entirety.

BACKGROUND OF THE INVENTION

1. Field of the Invention

The present invention relates to a power storage system and a manufacturing method of the power storage system.

2. Description of the Related Art

With the aim of realizing an Internet of Things (IoT) society in which everything is connected to the Internet, the spread of IoT edge devices, which are devices connected to the Internet, is expected. The materials and shapes of IoT edge devices vary depending on the scene of use, and, therefore, a high degree of design freedom is required.

Further, the IoT edge devices require a power storage system that includes an environmental power generation element and a power storage element as a driving source, and circuits associated with such elements. Particularly, in a usage environment in which an environmental power generation element cannot be used, and for purposes requiring relatively high output such as communication or calculations, a power storage system including a power storage element is required. As power storage elements for power storage systems, the use of primary batteries and non-aqueous electrolyte secondary batteries has been studied (see, for example, Non-patent Document 1).

However, power storage elements, which are manufactured by small-lot mass-production as in the related art, have a uniform size and shape that conforms to a standard, and thus have a low degree of design freedom. Further, manufacturing methods of the related art make it difficult to implement wide-variety small-quantity production. Therefore, in order to improve the degree of design freedom, a technique for manufacturing an all solid secondary battery using the inkjet printing technology, has been proposed (see, for example, Patent Document 1).

Non-patent Document 1: Small Energy Device (UMA series), Technical note, No. C2M1CXS-231D
Patent Document 1: Japanese Unexamined Patent Application Publication No. 2016-207540

SUMMARY OF THE INVENTION

According to one aspect of the present invention, there is provided a power storage system including a power storage element; and a voltage detecting unit configured to detect an output voltage of the power storage element, wherein the power storage element and the voltage detecting unit are formed by integrally forming structural materials of the power storage element and the voltage detecting unit on the same base material, without any point bonding portions formed by solder mounting.

DETAILED DESCRIPTION OF THE PREFERRED EMBODIMENTS

Figure 1:
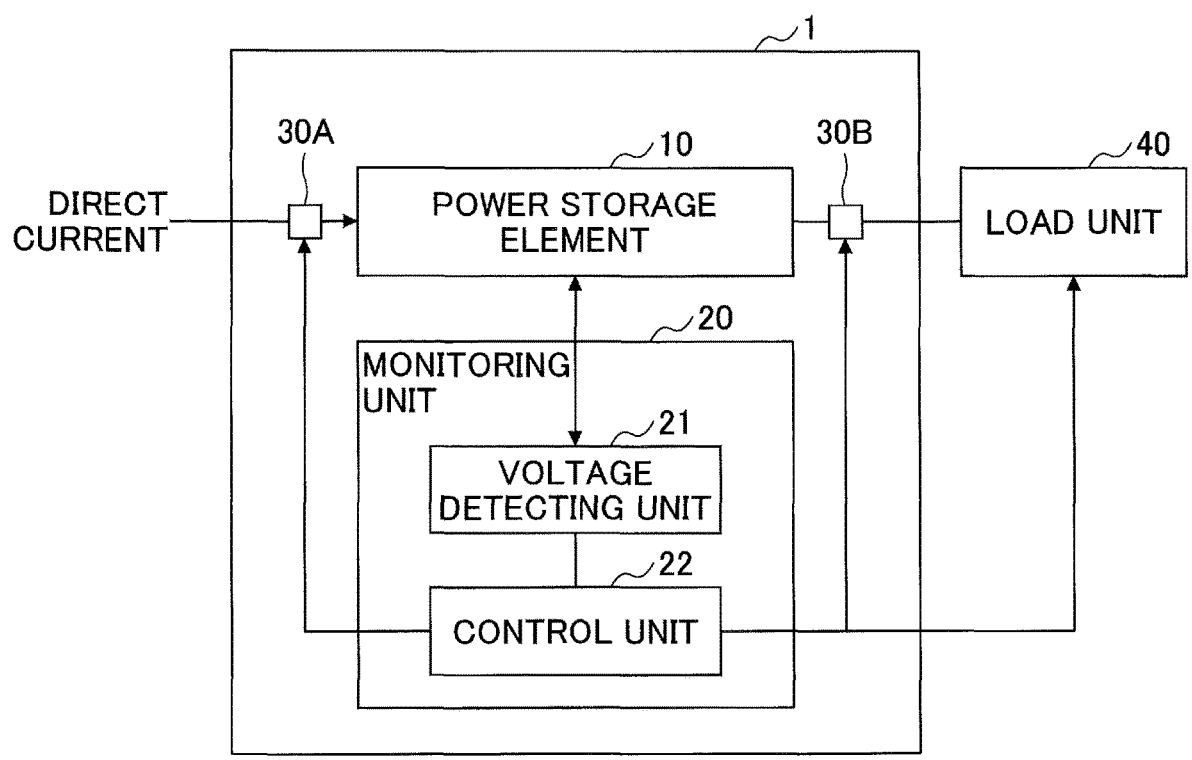
FIG. 1 is a block diagram illustrating a configuration of a power storage system according to an embodiment of the present embodiment.

In the above-described technique using inkjet printing, after forming a laminated body, a process of hot pressing by a press mold and firing at a temperature of 500 degrees Celsius to 1000 degrees Celsius is required, and the shape of the power storage element is defined by the shape of the press mold, and the base material that can be used is limited to a material having high heat resistance. Therefore, the above-described technique by inkjet printing is far from having a high degree of design freedom.

A problem to be addressed by an embodiment of the present invention is to provide a power storage system having a high degree of design freedom.

Hereinafter, an embodiment for carrying out the present invention will be described with reference to the drawings. In the drawings, the same elements are denoted by the same reference numerals and overlapping descriptions may be omitted.

FIG. 1 is a block diagram illustrating a configuration of a power storage system according to the present embodiment. As illustrated in FIG. 1, a power storage system 1 includes a power storage element 10, a monitoring unit 20, and switch units 30A and 30B. The power storage system 1 supplies the power charged in the power storage element 10 to a load unit 40. In the power storage system 1, the power storage element 10, a voltage detecting unit 21, and the switch units 30A and 30B can be formed, for example, by inkjet printing on the same insulating base material.

The power storage element 10 is, for example, a non-aqueous electrolyte secondary battery (e.g., a lithium ion secondary battery) that can be charged and discharged, and has a positive electrode, a negative electrode, and an electrolyte. The power storage element 10 is repeatedly charged and discharged between a lower limit voltage VL and an upper limit voltage VH.

The lower limit voltage VL is the output voltage when the remaining capacity of the power storage element 10 during discharging drops to a predetermined value (e.g., 20%), and is an output voltage (e.g., 2.7 V) that is higher than the output voltage (e.g., 2.5 V) at the time of complete discharge.

The upper limit voltage VH is the output voltage when the remaining capacity of the power storage element 10 during charging rises to a predetermined value (e.g., 80%), and is an output voltage (e.g., 3.7 V) that is lower than the voltage (e.g., 4.2 V) at the time of full charge.

The monitoring unit 20 is electrically coupled to the power storage element 10. The monitoring unit 20 includes the voltage detecting unit 21 and a control unit 22.

The voltage detecting unit 21 is coupled to the power storage element 10 and detects the voltage of the power storage element 10.

The control unit 22 is coupled to the voltage detecting unit 21, the switch unit 30A, the switch unit 30B, and the load unit 40. The control unit 22 calculates the remaining capacity of the power storage element 10 corresponding to the voltage detected by the voltage detecting unit 21. The control unit 22 controls the charging and the discharging of the power storage element 10 so that the voltage of the power storage element 10 is within the range of the lower limit voltage VL and the upper limit voltage VH.

The control unit 22 includes a storage means for storing a control program and various kinds of storage information, and an arithmetic means that operates based on the control program. The storage means may be a Random Access Memory (RAM), a Read-Only Memory (ROM), a storage, etc. The arithmetic means is, for example, a Central Processing Unit (CPU). The control unit 22 is implemented as the arithmetic means reads and executes the control program, etc., stored in the storage means. Further, the storage means included in the control unit 22 may store information representing the charging/discharging characteristics of the power storage element 10.

The arithmetic means may be a processor programmed to execute each function by software, such as a processor implemented by an electronic circuit, or an Application Specific Integrated Circuit (ASIC), a digital signal processor (DSP), a field programmable gate array (FPGA), a System on a chip (SOC), or a Graphics Processing Unit (GPU), designed to execute a predetermined function. Further, the arithmetic means may be a circuit module and the like.

When the output voltage of the power storage element 10 detected by the voltage detecting unit 21 is less than the lower limit voltage VL, the control unit 22 reports, to the load unit 40, for example, an alarm signal indicating an over-discharged state.

The output side of the power storage element 10 is coupled to the load unit 40 via the switch unit 30B. Power is supplied to the load unit 40 from the power storage element 10.

The switch unit 30A is provided on the input side of the power storage element 10. The switch unit 30A couples or cuts off the direct (DC) current to the power storage element 10.

The switch unit 30B is provided on the output side of the power storage element 10. The switch unit 30B couples or cuts off the power storage element 10 to or from the load unit 40.

The load unit 40 operates by receiving power from the power storage system 1. The load unit 40 may be, for example, a generator or a motor of an edge device such as a wearable device, an electronic device, a hybrid vehicle, an electric vehicle, a ship, an aircraft, and the like.

The load unit 40 starts operating when the voltage supplied from the power storage system 1 becomes greater than or equal to a predetermined value (for example, 4.2 V), and stops operating when the voltage supplied from the power storage system 1 becomes less than or equal to a predetermined value (for example, 2.5 V). Note that the voltage of the load unit 40 at the time of starting operation and at the time of stopping operation is suitably designed to be a voltage value corresponding to the type of the power storage element 10, the usage purpose of the power storage system 1, and the like.

The operation of the power storage system 1 will be described. When the DC current is supplied from the outside to the power storage element 10 via the switch unit 30A, the power storage element 10 is charged. At this time, the switch unit 30A couples the power storage element 10 to the DC current input portion (ON), and the switch unit 30B cuts off the power storage element 10 from the load unit 40 (OFF).

When the power storage element 10 is discharged, the DC current flows from the power storage element 10 to the load unit 40 via the switch unit 30B, and power is supplied from the power storage element 10 to the load unit 40. At this time, the switch unit 30A cuts off the power storage element 10 from the DC current input portion, and the switch unit 30B couples the power storage element 10 to the load unit 40. The power storage system 1 charges and discharges the power storage element 10 in accordance with the remaining capacity of the power storage element 10, the state of the load unit 40, and the like.

The monitoring unit 20 monitors the voltage of the power storage element 10. When the voltage detecting unit 21 detects that the power storage element 10 has been charged in excess of the upper limit voltage VH, the control unit 22 turns off the switch unit 30A and cuts off the charging. Further, when the voltage detecting unit 21 detects that the power storage element 10 has been discharged below the lower limit voltage VL, the control unit 22 turns off the switch unit 30B and cuts off the discharge to the load unit 40.

Next, the main part configuring the power storage system 1 will be described in further detail below.

<Cross-Sectional Structure of Power Storage Element>

Figure 2A:
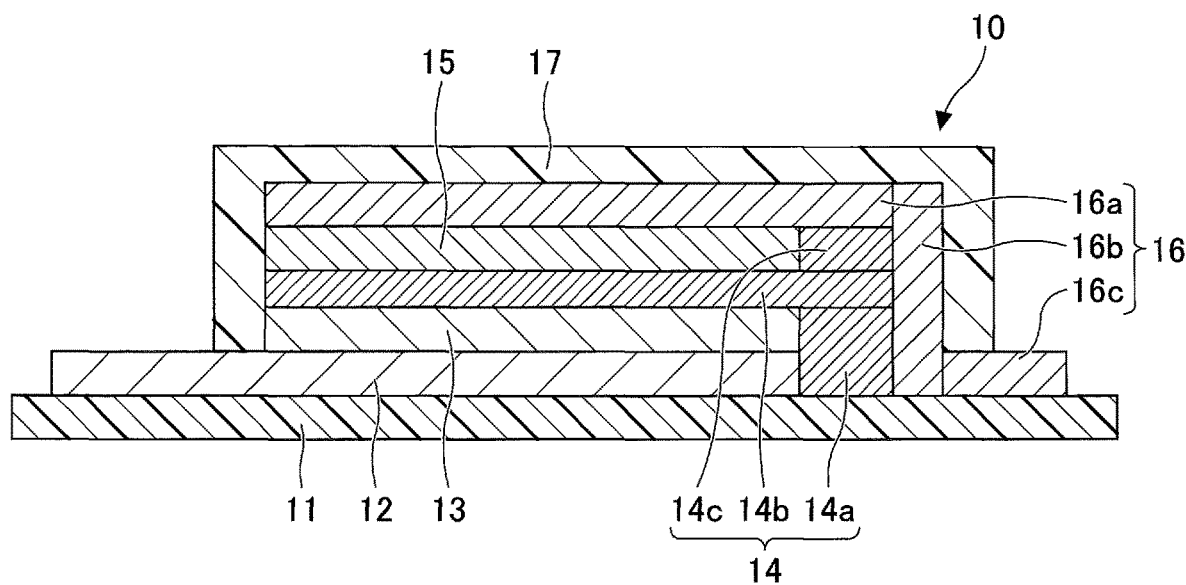
FIGS. 2A and 2B are cross-sectional views illustrating an example of a structure of a power storage element according to an embodiment of the present embodiment.
Figure 2B:
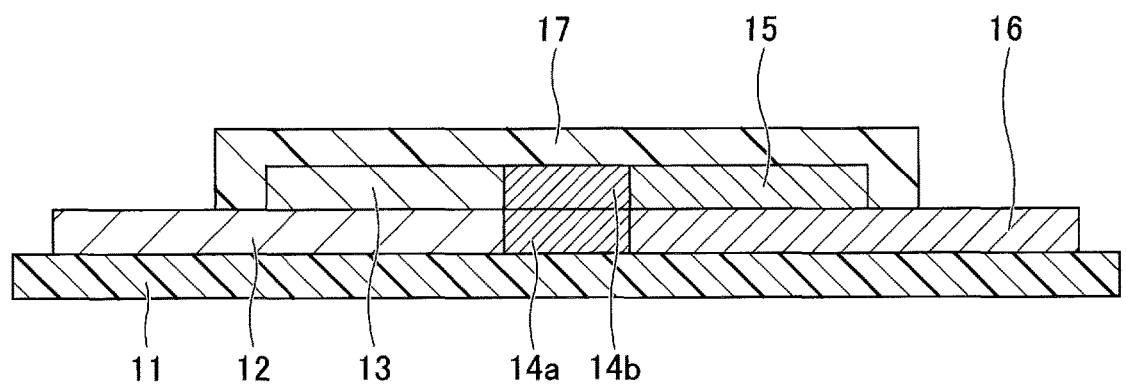

FIGS. 2A and 2B are cross-sectional views illustrating an example of the structure of the power storage element according to the present embodiment. Referring to FIG. 2A, the power storage element 10 is, for example, a non-aqueous electrolyte secondary battery in which a positive electrode and a negative electrode are each formed of a single layer. The power storage element 10 includes an insulating base material 11, a first electrically conductive layer 12, a negative electrode mixture layer 13, an electrolyte layer 14, a positive electrode mixture layer 15, a second electrically conductive layer 16, and a sealing layer 17.

In the power storage element 10, the first electrically conductive layer 12 is formed on the insulating base material 11, the negative electrode mixture layer 13 is formed on the first electrically conductive layer 12, and the electrolyte layer 14 is formed on the negative electrode mixture layer 13. Further, the positive electrode mixture layer 15 is formed on top of the electrolyte layer 14, and the second electrically conductive layer 16 is formed on top of the positive electrode mixture layer 15.

The electrolyte layer 14 includes an electrolyte layer 14a in the step portion formed by the first electrically conductive layer 12 and the negative electrode mixture layer 13 with respect to the insulating base material 11, an electrolyte layer 14b formed on the electrolyte layer 14a and the negative electrode mixture layer 13, and an electrolyte layer 14c formed on an outer peripheral portion of the electrolyte layer 14b that is not above the negative electrode mixture layer 13.

The second electrically conductive layer 16 includes a second electrically conductive layer 16a formed on the positive electrode mixture layer 15 and on the electrolyte layer 14c, a second electrically conductive layer 16b formed so as to be coupled to the second electrically conductive layer 16a, on the side of the electrolyte layer 14 opposite to the side on which the first electrically conductive layer 12 is exposed, and a second electrically conductive layer 16c formed to be coupled to the second electrically conductive layer 16b on the insulating base material 11.

The laminated structure, including the insulating base material 11, the first electrically conductive layer 12, the negative electrode mixture layer 13, the electrolyte layer 14, the positive electrode mixture layer 15, and the second electrically conductive layer 16, is covered by the sealing layer 17. However, a portion of the first electrically conductive layer 12 and the second electrically conductive layer 16 are exposed from the sealing layer 17 for electrical coupling to an external circuit.

Preferably, the laminated portion of the first electrically conductive layer 12 and the negative electrode mixture layer 13 and the laminated portion of the positive electrode mixture layer 15 and the second electrically conductive layer 16 are disposed to face each other with a certain space maintained therebetween, with the electrolyte layer 14 interposed therebetween.

As illustrated in FIG. 2A, the negative electrode mixture layer 13 and the positive electrode mixture layer 15 may be stacked in a vertical direction with respect to the plane of the base material, or as illustrated in FIG. 2B, the negative electrode mixture layer 13 and the positive electrode mixture layer 15 may be formed in regions that are not overlapping each other in a planar view.

Note that in some cases, either one of the negative electrode mixture layer 13 and the positive electrode mixture layer 15 may be referred to as a first electrode mixture layer, and the other one may be referred to as a second electrode mixture layer.

<Method of Manufacturing Power Storage Element>

FIGS. 3A to 4C are diagrams illustrating an example of a method of manufacturing the power storage element according to the present embodiment, and cross-sections corresponding to FIG. 2A are illustrated.

The power storage element 10 can be formed on the insulating base material 11 by a coating process by applying a printing process. Printing processes include flexographic printing, offset printing, gravure printing, gravure offset printing, screen printing, inkjet printing, and the like.

Note that the voltage detecting unit 21, the switch unit 30A, and the switch unit 30B can be formed together with the power storage element 10 on the same insulating base material 11 by a printing process. In this case, the power storage element 10, the voltage detecting unit 21, the switch unit 30A, and the switch unit 30B are integrally formed on the same base material without any point bonding portions formed by solder mounting.

In order to form various elements on the same insulating base material 11 by a coating process by applying a printing process, it is desirable to use a non-contact printing process, and it is particularly preferable to use inkjet printing.

Hereinafter, an example will be described in which inkjet printing is used for the method of forming each part of the power storage element 10.

<<Formation of First Electrically Conductive Layer>>

First, the insulating base material 11 is prepared. Examples of the material of the insulating base material 11 include glass, glass epoxy, polyimide (PI), polyethylene naphthalate (PEN), polyethylene terephthalate (PET), cellulose paper, rubber, and the like.

Next, a conductive liquid composition including, for example, at least one type of metal nanoparticles or fiber of silver, copper, gold, nickel, and aluminum, or a highly conductive carbon material such as carbon nanotubes, graphene, and the like, is fabricated.

Figure 3A:
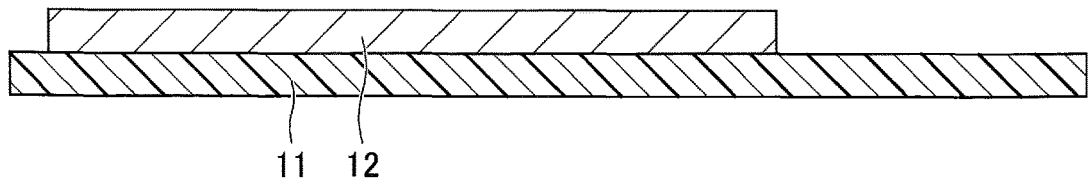
FIGS. 3A to 3D are diagrams (part 1) illustrating an example of a method of manufacturing a power storage element according to an embodiment of the present embodiment.

Next, as illustrated in FIG. 3A, inkjet printing is performed to discharge the above-described liquid composition onto the insulating base material 11 to form the first electrically conductive layer 12. According to inkjet printing, the first electrically conductive layer 12 can be formed in any shape and at any position on the insulating base material 11.

The average particle size of the dispersing element in the liquid composition for forming the electrically conductive layer is preferably 0.01 μm or more and 3 μm or less, and the viscosity at 25° C. of the liquid composition for forming the electrically conductive layer is preferably in the range of 3 mPa·s or more and 18 mPa·s or less. The same applies to liquid composition for forming other members.

When the average particle size of the dispersing element in the liquid composition for forming the electrically conductive layer is 0.01 μm or more, the discharge stability of the liquid composition is stabilized. When the average particle size of the dispersing element in the liquid composition for forming the electrically conductive layer is 3 μm or less, the storage stability of the liquid composition is improved. Further, when the viscosity at 25° C. of the liquid composition for forming the electrically conductive layer is in the range of 3 mPa·s or more and 18 mPa·s or less, it is easy to discharge the liquid composition as liquid droplets, so that the discharge amount can be easily controlled.

Here, the average particle size refers to the volume average particle size based on the effective diameter, and the average particle size is measured by, for example, a laser diffraction/scattering method, a dynamic light scattering method, and the like. Further, the viscosity at 25° C. of the liquid composition is measured at 100 rpm with a No. CPA-40Z rotor attached to a B-type viscometer (cone plate viscometer).

After the printing step, the liquid composition can be fired by a firing method commonly performed in the art. In the case of metal nanoparticles, in order to prevent oxidation, the liquid composition is more preferably dried and fired in a vacuum of $10^{-4}$ Pa or less, in a nitrogen atmosphere, or in an argon atmosphere. In order to enhance sintering, optical firing by using a xenon flash lamp can also be performed.

<<Formation of Negative Electrode Mixture Layer>>

To form the negative electrode mixture layer 13, a liquid composition containing, for example, a negative electrode active material, a dispersion medium, a conduction assisting agent, a dispersant, and a solid electrolyte or a gel electrolyte, is fabricated.

Figure 3B:
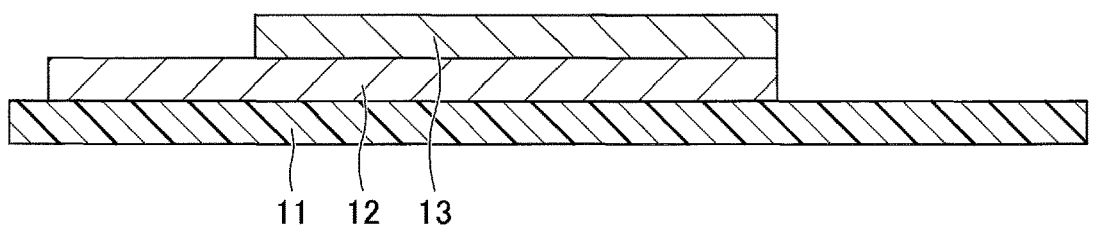

Then, as illustrated in FIG. 3B, inkjet printing is performed to discharge the liquid composition described above onto the first electrically conductive layer 12, to form the negative electrode mixture layer 13. At this time, a portion of the outer peripheral portion of the first electrically conductive layer 12 is left uncovered, where the negative electrode mixture layer 13 is not stacked.

(Negative Electrode Active Material)

The negative electrode active material may be a material capable of attracting and detaching a metal to be alloyed with alkali metal ions, such as Li ions and Na ions. Examples of such a material include a composite oxide of a transition metal and Li, a metal oxide, an alloy-based material, an inorganic compound such as a transition metal sulfide, a carbon material, an organic compound, or Li metal or Na metal, and the like.

Composite oxides include $LiMnO_2$, $LiMn_2O_4$, lithium titanate ($Li_4Ti_5O_{12}$, $Li_2Ti_3O_7$), lithium manganate ($LiMg_{1/2}Ti_{3/2}O_4$), lithium cobalt titanate ($LiCo_{1/2}Ti_{3/2}O_4$), lithium zinc titanate ($LiZn_{1/2}Ti_{3/2}O_4$), lithium iron titanate ($LiFeTiO_4$), lithium chrom titanate ($LiCrTiO_4$), lithium strontium titanate ($Li_2SrTi_6O_{14}$), lithium barium titanate ($Li_2BaTi_6O_{14}$), and the like.

Examples of sodium complex oxides include sodium titanate, such as $Na_2Ti_3O_7$ and $Na_4Ti_5O_{12}$. Some of the Ti and Na of the sodium titanate may be replaced by other elements. Such elements include, for example, at least one kind selected from the group consisting of Ni, Co, Mn, Fe, Al, and Cr.

Examples of the metal oxide include $TiO_2$, $Nb_2TiO_7$, $WO_3$, $MoO_2$, $MnO_2$, $V_2O_5$, $SiO_2$, $SiO$, $SnO_2$, and the like.

Examples of alloy-based materials include Al, Si, Sn, Ge, Pb, As, Sb, and the like. Examples of transition metal sulfides include FeS and TiS. Carbon materials include graphite, hardly graphitizable carbon, easily graphitizable carbon, and the like. As the inorganic compound, a compound in which the transition metal of the complex oxide described above is substituted with a heterogeneous element, may be used.

These negative electrode active materials may be used alone or two or more kinds may be used in combination.

(Dispersion Medium)

The dispersion medium is not particularly limited as long as the dispersion of the active material is possible, and examples are an aqueous dispersion medium such as water, ethylene glycol, propylene glycol, and the like, and an organic dispersion medium such as N-methyl-2-pyrrolidone, 2-pyrrolidone, cyclohexanone, butyl acetate, mesitylene, 2-n-butoxymethanol, 2-dimethylethanol, N,N-dimethylacetamide, and the like. Note that the dispersion medium may be used alone or two or more kinds may be used in combination.

(Conduction Assisting Agent)

The conduction assisting agent may be complexed with the active material in advance, or may be added when preparing the dispersion liquid.

As the conduction assisting agent, for example, a conductive carbon black formed by a furnace method, an acetylene method, a gasification method, and the like, and a carbon material such as carbon nanofibers, carbon nanotubes, graphene, graphite particles, and the like, may be used.

As a conduction assisting agent other than a carbon material, for example, metal particles or a metal fiber such as aluminum may be used.

The mass ratio of the conduction assisting agent to the active material is preferably 10% or less, and more preferably 8% or less. When the mass ratio of the conduction assisting agent to the active material is 10% or less, the stability of the dispersion liquid is improved.

(Dispersant)

The dispersant is not particularly limited as long as the dispersibility of the active material in the dispersion medium, the polymer particles, and the conduction assisting agent can be improved, and examples are a polymer type such as a polycarboxylic acid-based type, a naphthalene sulfonate formalin condensate-based type, a polyethylene glycol, a polycarboxylic acid partial alkyl ester-based type, a polyether-based type, a polyalkylene polyamine-based type; a surface active agent type such as an alkyl sulfonate-based type, a quaternary ammonium-based type, a high alcohol alkylene oxide-based type, a multivalent alcohol ester-based type, an alkyl polyamine-based type; and an inorganic type such as a polyphosphate-based type, and the like.

(Solid Electrolyte or Gel Electrolyte)

As the electrolytes, solid electrolytes of ceramics such as oxides and sulfides, gel electrolytes, and complex electrolytes of ceramics and polymers, may be used.

Examples of oxides include LISICON type oxides such as γ-$Li_3PO_4$, $Li_3BO_4$, a 0.75$Li_4GeO_4$-0.25$Li_2ZnGeO_4$ solid solution, a $Li_4SiO_4$—$Zn_2SiO_4$ solid solution, a $Li_4GeO_4$—$Li_3VO_4$ solid solution; NASICON type oxides such as $Li_{1.3}Al_{0.3}Ti_{1.7}$ $(PO_4)_3$, $Li_{1.6}Al_{0.6}Ge_{0.8}Ti_{0.6}$ $(PO_4)_3$; perovskite type structures such as (Li,La)$TiO_3$; garnet type oxides such as $La_5Li_3Nb_2O_{12}$, $Li_5La_3TaO_{12}$, $Li_7La_3Zr_2O_{12}$.

Sulfides include $Li_4GeS_4$—$Li_3PS_4$ solid solution, $Li_4SiS_4$—$Li_3PS_4$ solid solution, $Li_3PS_4$—$Li_2S$ solid solution, $Li_2S$—$P_2S_s$ solid solution, $Li_2S$—$SiS_2$, $Li_{10}GeP_2S_{12}$, and $Li_7P_3S_{11}$ crystals.

(Ceramic Solid Electrolyte for Sodium-Ion Secondary Battery)

Examples of oxides include NASICON-type $Na_{1+x}Zr_2Si_xP_{3-x}O_{12}$ (0≤x≤1), and β-alumina-type $Na_2O$-11$Al_2O_3$. Sulfides include $Na_2S$—$P_2S_5$, $Na_3PS_4$, $Na_3SbS_4$, $Na_2S$—$SiS_2$, $Na_2S$—$GeS_2$, and the like. Examples of selenide include $Na_3PSe_4$ and the like.

Inorganic materials for gel electrolytes include tetrahydroxysilane (TEOS), siloxane, fumed silica ($SiO_2$), and fumed alumina ($Al_2O_3$). At least one of these inorganic particles and the ionic liquid are mixed so that the weight ratio of the ionic liquid to inorganic particles is in the range of 50% or more and 200% or less.

As ionic liquids, cationic species include Li$^+$ or Na$^+$, and at least one of BMP (1-butyl-1-methylpyrrolidinium), EMI (1-ethyl-3-methylimidazolium), and BMMI (1-butyl-2,3-dimethylimidazolium), and anionic species include TFSI (bis (trifluoromethaneSulfonyl)imide, and FSI (bifluorosulfonyl) imide.

Polymers for gel electrolytes include polyethylene oxide (PEO), polymethyl methacrylate (PMMA), polyacrylonitrile (PAN), and polyvinylidene fluoride (PVDF). At least one of these polymers and a non-aqueous electrolyte solution containing electrolyte salt are mixed so that the weight ratio of the non-aqueous electrolyte solution to the polymer is in the range of 100% or more and 2000% or less.

The electrolyte salt is not particularly limited as long as the electrolyte salt has high ionic conductivity and can be dissolved in a non-aqueous solvent. The electrolyte salt preferably includes halogen atoms. Examples of the cations forming the electrolyte salt include lithium ions, sodium ions, and the like. Examples of the anions forming the electrolyte salt include $BF_4^-$, $PF_6^-$, $AsF_6^-$, $CF_3SO_3^-$, $(CF_3SO_2)_2N^-$, $(C_2F_5S_2)_2N^-$, $(C_2F_5SO_2)_2N-$, $(FSO_2)_2N-$, $(CF_3SO_2)_3C^-$, and the like.

The lithium salt is not particularly limited and may be appropriately selected depending on the purpose, and examples of lithium salts include lithium hexafluorophosphate ($LiPF_6$), lithium borofluoride ($LiBF_4$), lithium hexafluoride ($LiAsF_6$), lithium trifluorometasulfonate ($LiCF_3SO_3$), lithium bis (trifluoro methyl sulfonyl) imide ($LiN(CF_3SO_2)_2$), lithium (bis pentafluoroethylsulfonyl) imide ($LiN(C_2F_5SO_2)_2$), and the like. Among these, $LiPF_6$ is preferable from the viewpoint of ionic conductivity, and $LiBF_4$ is preferable from the viewpoint of stability.

Sodium salts are not particularly limited, and may be appropriately selected depending on the purpose, and examples of sodium salts include sodium hexafluorophosphate ($NaPF_6$), sodium borofluoride ($NaBF_4$), sodium hexafluoroarsenate ($NaAsF_6$), sodium trifluorometasulfonate ($NaCF_3SO_3$), sodium bis (trifluoromethylsulfonyl) imide ($NaN(CF_3SO_2)_2$), sodium (bipentafluoroethylsulfonyl)imide ($NaN(C_2F_5SO_2)_2d$), and the like.

Note that the electrolyte salt may be used alone or two or more kinds may be used in combination.

The concentration of the electrolyte salt in the non-aqueous electrolyte solution may be appropriately selected depending on the purpose. However, in the case of a swing type power storage element, it is preferable that the concentration is 1 mol/L to 2 mol/L, and in the case of a reserve type power storage element, it is preferable that the concentration is 2 mol/L to 4 mol/L. The non-aqueous electrolytic solution is not particularly limited and may be appropriately selected depending on the purpose; however, a non-protic organic solvent is preferable.

As the non-protic organic solvent, a carbonate-based organic solvent, such as a chain carbonate or a cyclic carbonate, may be used. Among these, the chain carbonate is preferable because of the high solubility of the electrolyte salt. Further, it is preferable that the non-protic organic solvent has a low viscosity from the viewpoint of discharge stability.

Examples of the chain carbonate include dimethyl carbonate (DMC), diethyl carbonate (DEC), methyl ethyl carbonate (EMC), and the like.

The content of the chain carbonate in the non-aqueous solvent is not particularly limited and may be appropriately selected depending on the purpose, but is preferably 50% by mass or more. When the content of the chain carbonate in the non-aqueous solvent is 50% by mass or more, the cyclic material content is reduced even when the solvent other than the chain carbonate is a cyclic material with a high dielectric constant (e.g., cyclic carbonate, cyclic ester). Therefore, even when a non-aqueous electrolytic solution having a high concentration of 2 M or more is fabricated, the viscosity of the non-aqueous electrolytic solution decreases, and the impregnation of the non-aqueous electrolytic solution into the electrode and ion diffusion will be good.

Examples of the cyclic carbonate include propylene carbonate (PC), ethylene carbonate (EC), butylene carbonate (BC), vinylene carbonate (VC), and the like.

Note that as the non-aqueous solvent other than the carbonate-based organic solvent, an ester-based organic solvent, such as a cyclic ester, a chain ester, or an ether-based organic solvent, such as a cyclic ether, a chain ether, and the like, may be used according to need.

Examples of cyclic esters include γ-butyrolactone (γBL), 2-methyl-γ-butyrolactone, acetyl-γ-butyrolactone, γ-valerolactone, and the like.

Examples of the chain ester include alkyl ester propionate, dialkyl ester malonate, alkyl ester acetate (methyl acetate (MA), ethyl acetate, etc.), alkyl ester formate (methyl formate (MF), ethyl formate, etc.), and the like.

Examples of cyclic ethers include tetrahydrofuran, alkyltetrahydrofuran, alkoxytetrahydrofuran, dialkoxytetrahydrofuran, 1,3-dioxolane, alkyl-1,3-dioxolane, 1,4-dioxolane, and the like.

Examples of chain ethers include 1,2-dimethociquiethane (DME), diethyl ether, ethylene glycol dialkyl ether, diethylene glycol dialkyl ether, triethylene glycol dialkyl ether, tetraethylene glycol dialkyl ether, and the like.

(Binder)

The binder can be added to ensure a binding force, when the binding of the positive electrode material or the binding of the negative electrode material, or the binding between the positive electrode material or the negative electrode material and the electrically conductive layer, will be insufficient by using a dispersant or an electrolyte material. As long as the binding force can be applied, the binder is not particularly limited, but from the viewpoint of the inkjet discharging performance, a compound having a viscosity that does not increase is preferable. Monomeric compounds can be polymerized after inkjet printing, or polymeric particles can be used.

An example of a method of using a monomeric compound includes, for example, applying a dispersion liquid, the dispersion liquid including a compound having a polymerizable site and a polymerization initiator or catalyst, wherein the compound having the polymerizable site is dissolved, followed by heating or irradiation with nonionizing radiation or ionizing radiation or infrared radiation.

With regard to the polymerization site of the compound having a polymerizable site, there may be one intramolecular polymerization site or the polymerization site may be polyfunctional. Note that a polyfunctional polymerizable compound means a compound having two or more polymerizable groups, i.e., polymerizable sites. The polyfunctional polymerizable compounds are not particularly limited as long as the polyfunctional polymerizable compounds can be polymerized by heating or irradiation with non-ionizing radiation or ionizing radiation or infrared radiation, and examples of the polyfunctional polymerizable compounds include acrylate resins, methacrylate resins, urethane acrylate resins, vinyl ester resins, unsaturated polyesters, epoxy resins, oxetane resins, vinyl ethers, resins utilizing ene-thiol reactions, and the like. Among these, acrylate resins, methacrylate resins, urethane acrylate resins, and vinyl ester resins are preferable from the viewpoint of productivity.

Examples of the material forming the polymer particles include thermoplastic resins such as polyvinylidene fluoride, acrylic resin, styrene-butadiene copolymer, polyethylene, polypropylene, polyurethane, nylon, polytetrafluoroethylene, polyphenylene sulfide, polyethylene tephthalate, polybutylene tephthalate, and the like.

The mass ratio of the binder to the active material is preferably 10% or less and more preferably 5% or less. When the mass ratio of the binder to the active material is 10% or less, the binding force during the electrode formation is improved without impairing the discharge performance.

(Method of Manufacturing Liquid Composition)

The average particle size of the active material is preferably 3 µm or less, and more preferably 1 µm or less. When the average particle size of the active material is 3 µm or less, the discharge stability and sedimentation resistance of the liquid composition are improved. The d10 of the active material is preferably 0.1 µm or more, and more preferably 0.15 µm or more. When the d10 of the active material is 0.1 µm or more, the storage stability of the liquid composition is improved. The liquid composition according to the present embodiment may further include a conduction assisting agent, a dispersant, etc., according to need. Preferably, the viscosity at 25° C. of the liquid composition is 3 mPa·s or more and 18 mPa·s or less. More preferably, the viscosity is 9 mPa·s or more and 12 mPa·s or less.

<<Formation of Electrolyte Layer>>

To form the electrolyte layers 14a and 14b, a liquid composition containing, for example, a ceramic electrolyte, a dispersant, and a dispersion medium, is fabricated.

Figure 3C:
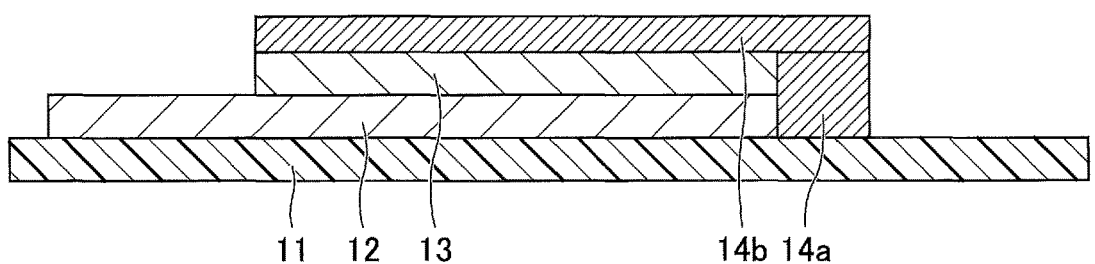

Then, as illustrated in FIG. 3C, by performing inkjet printing, the liquid composition is discharged to the step portion formed by the first electrically conductive layer 12 and the negative electrode mixture layer 13 with respect to the insulating base material 11, thereby forming the electrolyte layer 14a. Further, inkjet printing is performed to discharge the liquid composition described above onto the electrolyte layer 14a and the negative electrode mixture layer 13 to form the electrolyte layer 14b. At this time, a portion of the outer peripheral portion of the first electrically conductive layer 12 is exposed, so that a portion on which the negative electrode mixture layer 13 or the electrolyte layer 14b are not stacked is left uncovered.

<<Formation of the Positive Electrode Mixture Layer>>

To form the positive electrode mixture layer 15, a liquid composition containing, for example, a positive electrode active material, a conduction assisting agent, a dispersant, a solid electrolyte or gel electrolyte, and a dispersion medium, is fabricated.

Figure 3D:
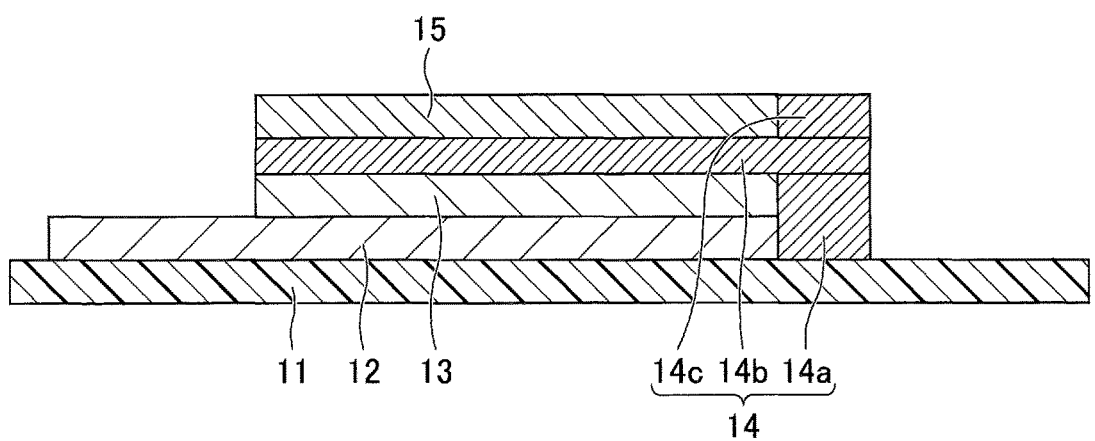

Then, as illustrated in FIG. 3D, by inkjet printing, the liquid composition is discharged onto the electrolyte layer 14b to form the positive electrode mixture layer 15. At this time, on the outer peripheral portion of the electrolyte layer 14b that is not above the negative electrode mixture layer 13, the positive electrode mixture layer 15 is not stacked. On the outer peripheral portion of the electrolyte layer 14b that is not above the negative electrode mixture layer 13, the electrolyte layer 14c is formed by the same method as in FIG. 3C. Accordingly, the electrolyte layer 14 including the electrolyte layers 14a, 14b, and 14c is completed.

The liquid composition for forming the positive electrode mixture layer 15 can be fabricated in the same manner as the liquid composition for forming the negative electrode mixture layer 13, except that the following positive electrode active material is used.

(Positive Electrode Active Material)

The positive electrode active material is not particularly limited as long as alkali metal ions can be reversibly absorbed and released; for example, an alkali metal containing transition metal compound may be used.

Examples of alkali metal-containing transition metal compounds include lithium-containing transition metal compounds such as a complex oxide containing lithium and one or more elements selected from a group consisting of cobalt, manganese, nickel, chromium, iron, and vanadium.

Examples of lithium-containing transition metal compounds include lithium-containing transition metal oxides such as lithium cobaltate, lithium nickelate, lithium manganate, and the like.

As the alkali metal containing transition metal compound, a polyanionic compound having an $XO_4$ tetrahedra (X=P, S, As, Mo, W, Si, etc.) in a crystalline structure may also be used. Among these, lithium-containing transition metal phosphate compounds, such as lithium iron phosphate and lithium vanadium phosphate, are preferable from the viewpoint of cycle characteristics. Particularly, vanadium lithium phosphate has a high lithium diffusivity and excellent output characteristics.

Note that it is preferable that the surface of the polyanionic-based compound is coated with a conduction assisting agent such as a carbon material and composited, in terms of electron conductivity.

Examples of the sodium-containing transition metal compound include oxides of the $NaMO_2$ type, sodium chromite ($NaCrO_2$), sodium ferrate ($NaFeO_2$), sodium nickelate ($NaNiO_2$), sodium cobaltate ($NaCoO_2$), sodium manganate ($NaMnO_2$), and sodium vanadate ($NaVO_2$). A portion of M may be substituted with a metallic element other than M and Na, for example, at least one element selected from a group consisting of Cr, Ni, Fe, Co, Mn, V, Ti, Al. The sodium-containing metal oxide may be $Na_2FePO_4F$, $NaVPO_4F$, $NaCoPO_4$, $NaNiPO_4$, $NaMnPO_4$, $NaMn_{1.5}Ni_{0.5}O_4$, $Na_2V_2(PO_4)_3$, and the like.

<<Formation of the Second Electrically Conductive Layer>>

The second electrically conductive layer 16 can be formed, for example, using a conductive liquid composition similar to that used to form the first electrically conductive layer 12.

Figure 4A:
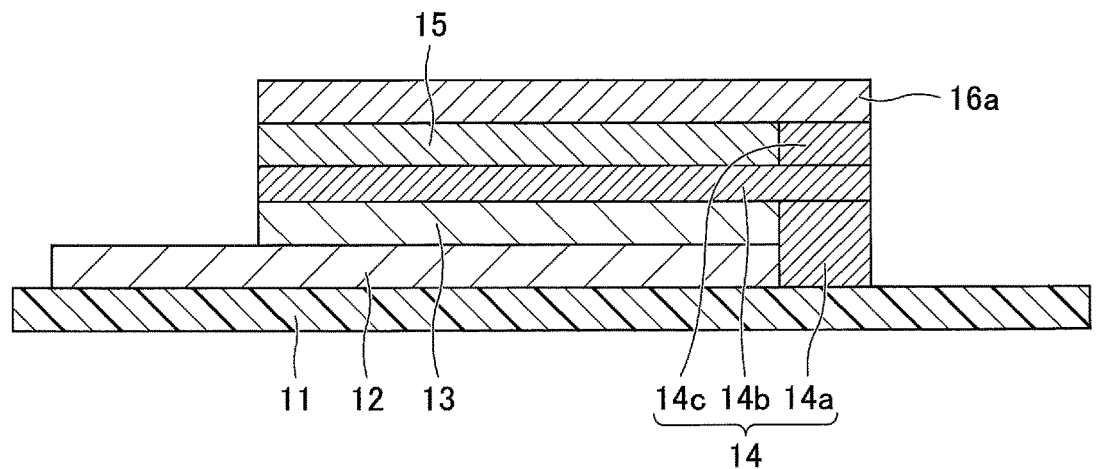
FIGS. 4A to 4C are diagrams (part 2) illustrating an example of a method of manufacturing a power storage element according to an embodiment of the present embodiment.

Then, as illustrated in FIG. 4A, inkjet printing is performed to discharge the above-described liquid composition on the positive electrode mixture layer 15 and the electrolyte layer 14c to form the second electrically conductive layer 16a. Then, the firing is performed as in the case of the first electrically conductive layer 12.

Figure 4B:
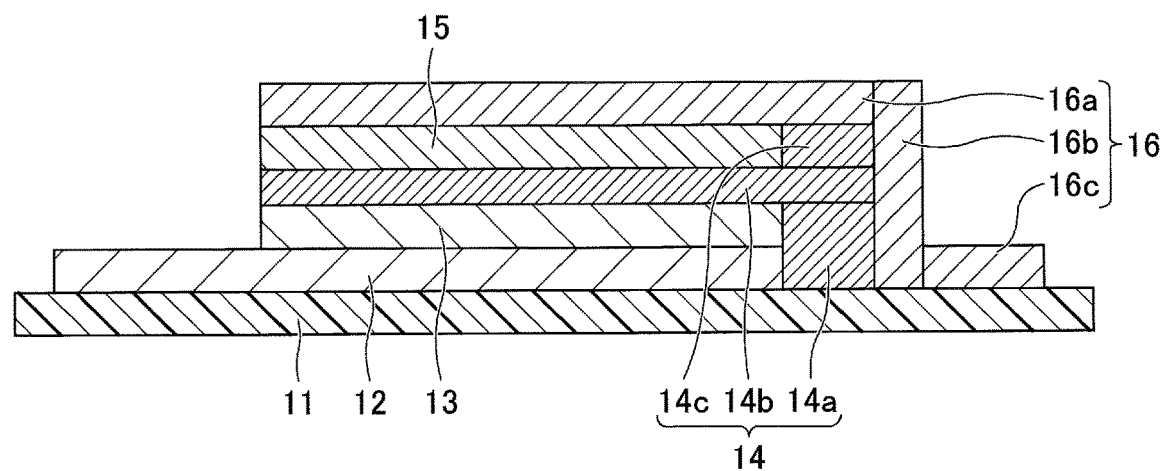

Further, as illustrated in FIG. 4B, the second electrically conductive layer 16b is formed so as to be coupled to the second electrically conductive layer 16a, on the side of the electrolyte layer 14 opposite to the side on which the first electrically conductive layer 12 is exposed. Then, on the insulating base material 11, the second electrically conductive layer 16c is formed to be coupled to the second electrically conductive layer 16b. Then, the firing is performed, similar to the case of the first electrically conductive layer 12. Accordingly, the second electrically conductive layer 16 including the second electrically conductive layers 16a, 16b, and 16c is completed. The second electrically conductive layer 16c can be used for electrical coupling to an external circuit.

(Planar Structure)

A case in which the negative electrode mixture layer and the positive electrode mixture layer are formed in regions that do not overlap each other in a planar view, will be described.

<<Formation of Electrically Conductive Layer>>

As illustrated in FIG. 2B, by inkjet printing, an inkjet composition of the electrically conductive layer is discharged onto the insulating base material 11 to form the first electrically conductive layer 12. According to inkjet printing, the first electrically conductive layer 12 can be formed in any shape and at any position on the insulating base material 11. Further, the second electrically conductive layer 16 can be formed at any position on the insulating base material 11 so as not to contact the first electrically conductive layer 12.

<<Formation of Electrode Mixture Layer>>

Then, as illustrated in FIG. 2B, by inkjet printing, a liquid composition containing a negative electrode active material is discharged onto the first electrically conductive layer 12 to form the negative electrode mixture layer 13. Similarly, by inkjet printing, a liquid composition containing a positive electrode active material is discharged onto the second electrically conductive layer 16 to form the positive electrode mixture layer 15. At this time, at a portion of the outer peripheral portion of the first electrically conductive layer 12 and at a portion of the outer peripheral portion of the second electrically conductive layer 16, portions where the negative electrode mixture layer 13 and the positive electrode mixture layer 15 are respectively not stacked are left uncovered.

<Formation of Electrolyte Layer>

Then, as illustrated in FIG. 2B, by inkjet printing, a liquid composition for forming an electrolyte layer is discharged to the step portion formed by the first electrically conductive layer 12 and the negative electrode mixture layer 13 with respect to the insulating base material 11, and to the step portion formed by the second electrically conductive layer 16 and the positive electrode mixture layer 15, to form the electrolyte layers 14a and 14b, respectively.

(Multilayer Lamination)

As illustrated in FIGS. 5A to 7B, by sequentially stacking the electrically conductive layer, the negative electrode layer, the insulating layer, the electrolyte layer, and the positive electrode layer, in a similar manner from a first electrically conductive layer $18_0$, a multilayer lamination can be obtained.

<<Formation of Electrically Conductive Layer>>

Figure 5A:
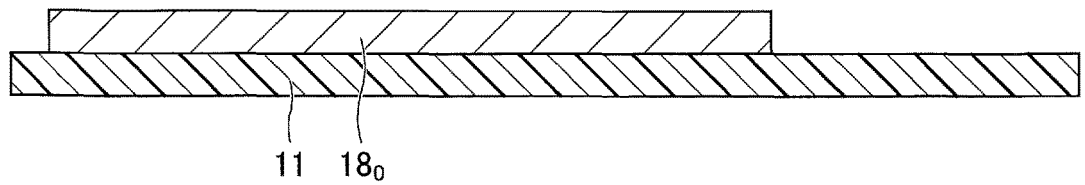
FIGS. 5A to 5D are diagrams (part 3) illustrating an example of a method of manufacturing a power storage element according to an embodiment of the present embodiment.

First, as illustrated in FIG. 5A, by inkjet printing, the liquid composition described above is discharged onto the insulating base material 11 to form the first electrically conductive layer $18_0$. According to inkjet printing, the first electrically conductive layer $18_0$ can be formed in any shape and at any position on the insulating base material 11. After the formation, firing may be performed in the same manner as the first electrically conductive layer 12 of FIG. 3A.

<<Formation of Negative Electrode Mixture Layer>>

Figure 5B:
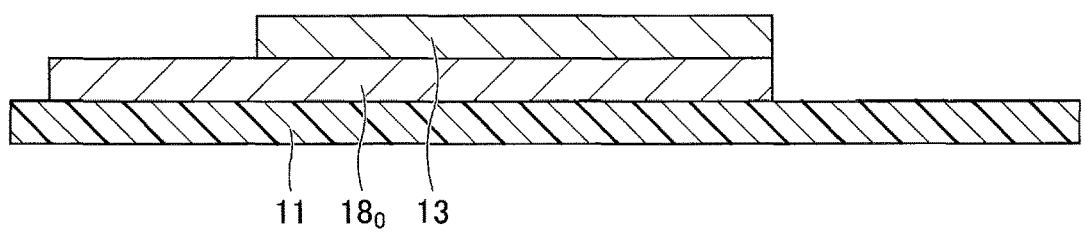

Then, as illustrated in FIG. 5B, by inkjet printing, the liquid composition for forming a negative electrode mixture layer is discharged onto the first electrically conductive layer $18_0$ to form the negative electrode mixture layer 13. At this time, at a portion of the outer peripheral portion of the first electrically conductive layer $18_0$, a portion where the negative electrode mixture layer 13 is not stacked is left uncovered.

<Formation of Electrolyte Layer>

Figure 5C:
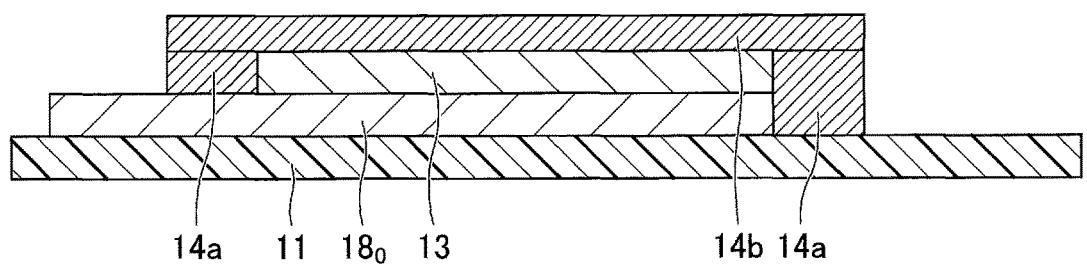

As illustrated in FIG. 5C, by inkjet printing, a liquid composition for the electrolyte layer is discharged to the step portion formed by the first electrically conductive layer $18_0$ and the negative electrode mixture layer 13 with respect to the insulating base material 11 and the step portion formed by the negative electrode mixture layer 13 with respect to the first electrically conductive layer $18_0$, thereby forming the electrolyte layer 14a. Further, by inkjet printing, a liquid composition for the electrolyte layer is discharged onto the electrolyte layer 14a and the negative electrode mixture layer 13 to form the electrolyte layer 14b. At this time, a portion of the outer periphery of the first electrically conductive layer $18_0$ is exposed, so that a portion on which the negative electrode mixture layer 13 or the electrolyte layer 14b are not stacked is left uncovered.

<<Formation of Positive Electrode>>

Figure 5D:
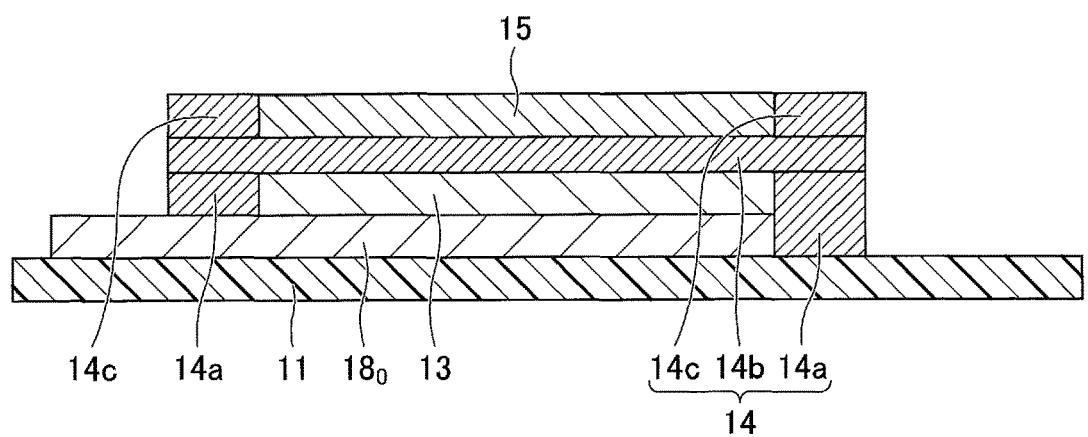

Then, as illustrated in FIG. 5D, by inkjet printing, a liquid composition for the positive electrode mixture layer is discharged onto the electrolyte layer 14b to form the positive electrode mixture layer 15. At this time, the positive electrode mixture layer 15 is not stacked on the outer peripheral portion of the electrolyte layer 14b that is not above the negative electrode mixture layer 13. The electrolyte layer 14c is formed on the outer peripheral portion of the electrolyte layer 14b that is not above the negative electrode mixture layer 13 in the same manner as that illustrated in FIG. 5B. Accordingly, the electrolyte layer 14 including the electrolyte layers 14a, 14b, and 14c is completed.

<<Formation of Electrically Conductive Layer>>

Figure 6A:
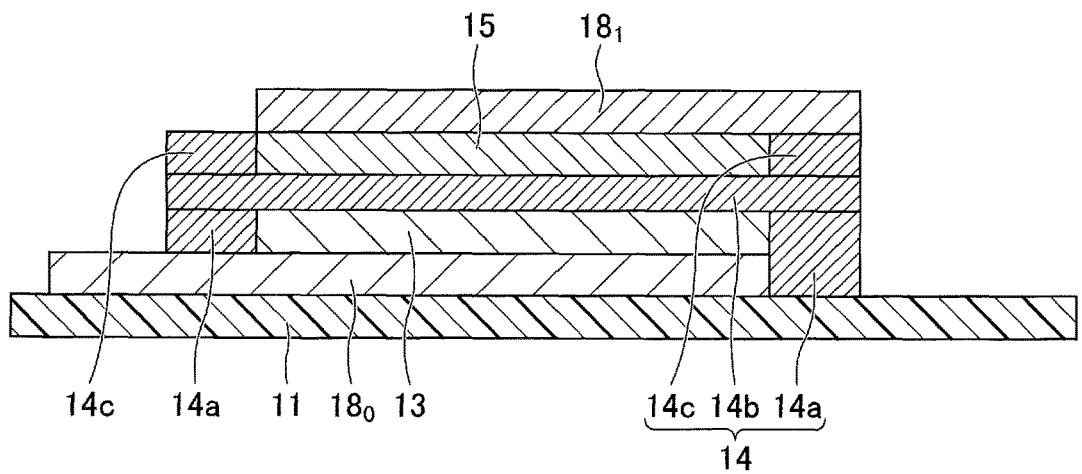
FIGS. 6A to 6C are diagrams (part 4) illustrating an example of a method of manufacturing a power storage element according to an embodiment of the present embodiment.

Then, as illustrated in FIG. 6A, by inkjet printing, a liquid composition for the electrically conductive layer is discharged onto the positive electrode mixture layer 15 and the electrolyte layer 14c to form a second electrically conductive layer $18_1$. Then, firing may be performed in the same manner as the first electrically conductive layer $18_0$.

<<Formation of Positive Electrode Mixture Layer>>

Figure 6B:
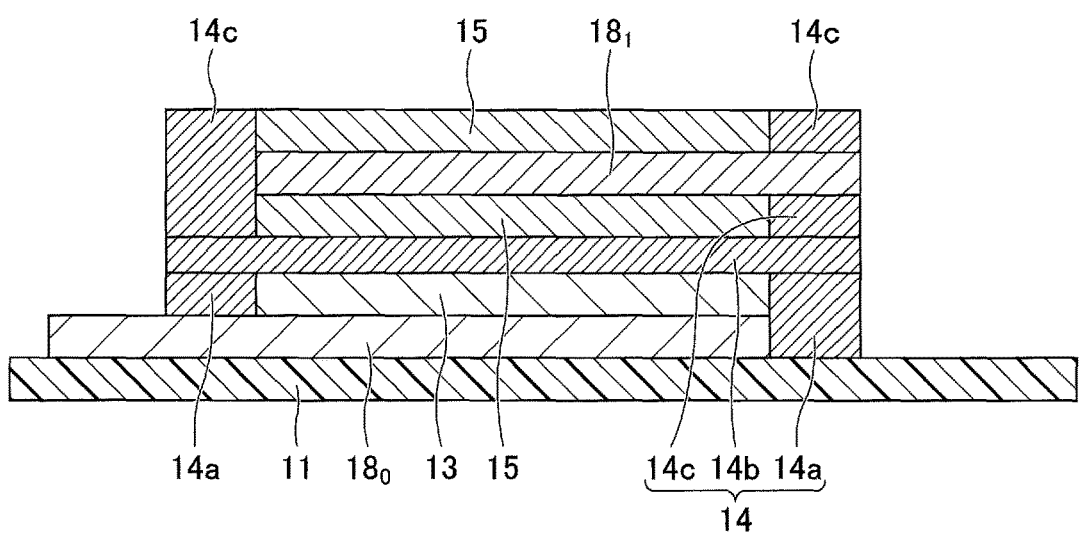

Then, as illustrated in FIG. 6B, by inkjet printing, a liquid composition for the positive electrode mixture layer is discharged onto the second electrically conductive layer $18_1$ to further form the positive electrode mixture layer 15. At this time, the positive electrode mixture layer 15 is not stacked on the outer peripheral portion of the second electrically conductive layer $18_1$ that is not above the positive electrode mixture layer 15. The electrolyte layer 14c is formed at the outer periphery of the second electrically conductive layer $18_1$ that is not above the positive electrode mixture layer 15 in the same manner as illustrated in FIG. 5D. As described above, it is possible to form the positive electrode layer formed of the positive electrode mixture layer 15 and the second electrically conductive layer $18_1$.

<Formation of Electrolyte Layer>

Figure 6C:
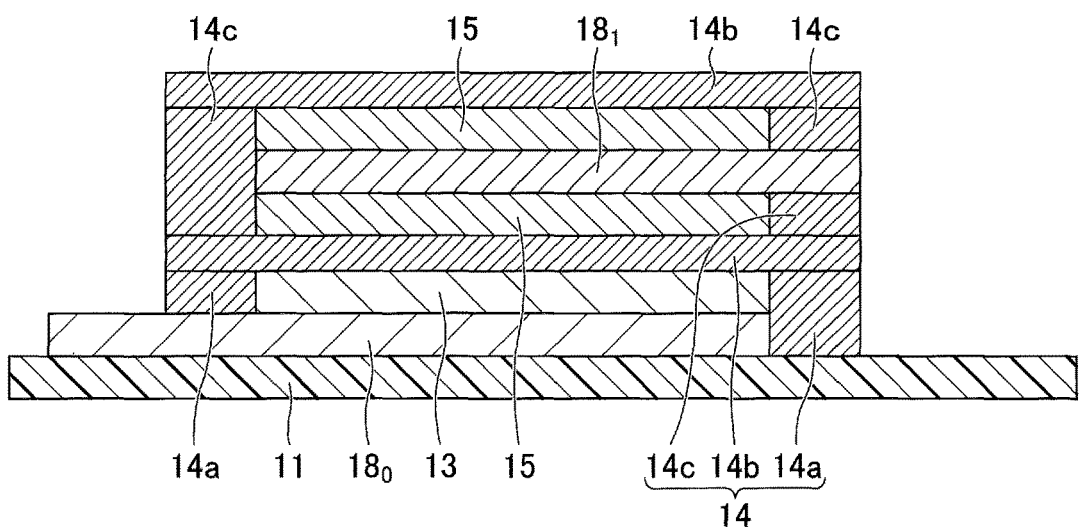

Then, as illustrated in FIG. 6C, by further inkjet printing, a liquid composition for the electrolyte layer is discharged onto the electrolyte layer 14c and the positive electrode mixture layer 15 to form the electrolyte layer 14b.

<<Electrode Layer Lamination>>

Figure 7A:
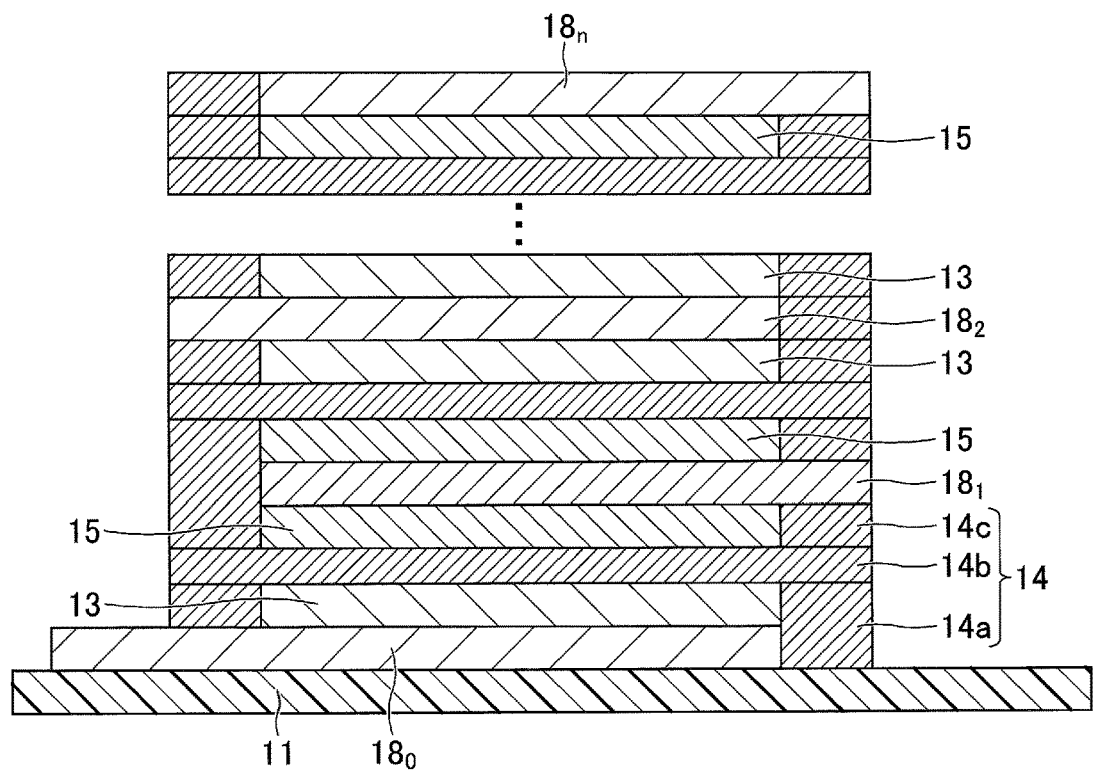
FIGS. 7A and 7B are diagrams (part 5) illustrating an example of a method of manufacturing a power storage element according to an embodiment of the present embodiment.

As illustrated in FIG. 7A, the layers can be sequentially stacked one by one in the same manner by inkjet printing in the order of the negative electrode layer, the electrolyte layer, the positive electrode layer, and the electrolyte layer. For example, the first electrically conductive layer $18_0$ to the n+1th electrically conductive layer $18_n$ are formed (n=2k+1, where k is an integer of 0 or more).

Figure 7B:
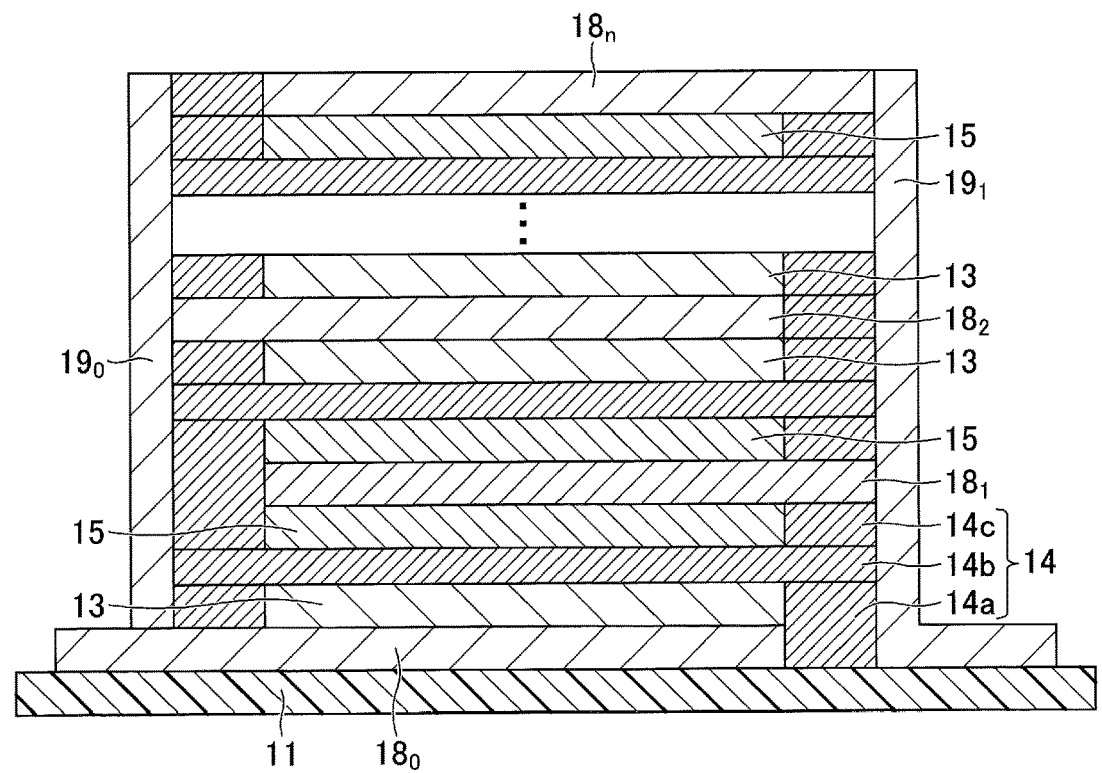

Next, as illustrated in FIG. 7B, on the side surface where the first electrically conductive layer $18_0$ is exposed on the insulating base material 11, an electrically conductive layer $19_0$ is formed, which is electrically coupled to the first electrically conductive layer $18_0$, a third electrically conductive layer $18_2$, . . . the nth electrically conductive layer $18_{n-1}$ (n=2k+1, where k is an integer of 0 or more). The electrically conductive layer $19_0$ is used for electrical contact between the first electrically conductive layer $18_0$, the third electrically conductive layer $18_2$, . . . the nth electrically conductive layer $18_{n-1}$ (n=2k+1, where k is an integer of 0 or more) and an external circuit.

Further, on the side surface opposite to the side where the first electrically conductive layer $18_0$ is exposed on the insulating base material 11, an electrically conductive layer $19_1$ further extending on the insulating base material 11 is formed, the electrically conductive layer $19_1$ being electrically coupled to the second electrically conductive layer $18_1$, a fourth electrically conductive layer $18_3$, . . . the n+1 electrically conductive layer $18_n$ (n=2k+1, where k is an integer of 0 or more). The electrically conductive layer $19_1$ is used for electrical contact between the second electrically conductive layer $18_1$, the fourth electrically conductive layer $18_3$, . . . the n+1 electrically conductive layer 18n (n=2k+1, where k is an integer of 0 or more) and an external circuit.

<<Formation of Sealing Layer>>

Figure 4C:
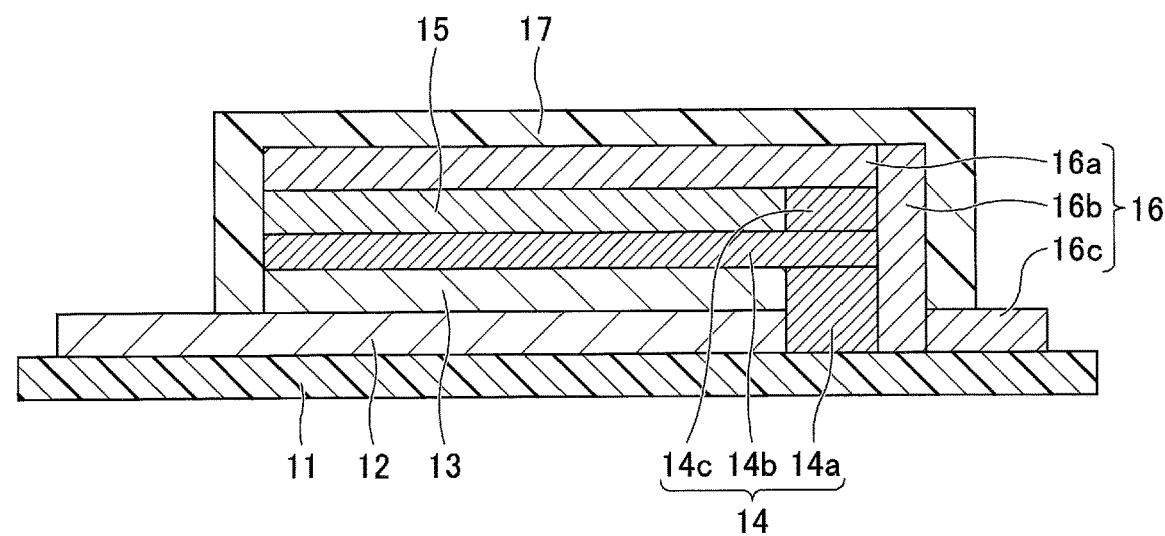

As illustrated in FIG. 4C, a parylene, polyimide, or siloxane having electrically insulating properties is formed on the first and second electrically conductive layers 12 and 16 by inkjet printing. Further, as a sealing layer, a fine oxide film, a nitride film, and an oxynitride film, such as a hafnium oxide ($HfO_x$), a zirconium oxide ($ZrO_x$), a silicon oxide ($SiO_x$), a silicon nitride (SiN), a silicon oxide nitride (SiON), an aluminum oxide ($AlO_x$), and the like, can be used, by a chemical vapor deposition method or an atomic layer deposition method. At this time, the portions of the first electrically conductive layer 12 and the second electrically conductive layer 16 are exposed from the sealing layer 17 for electrical coupling to an external circuit.

Figure 8:
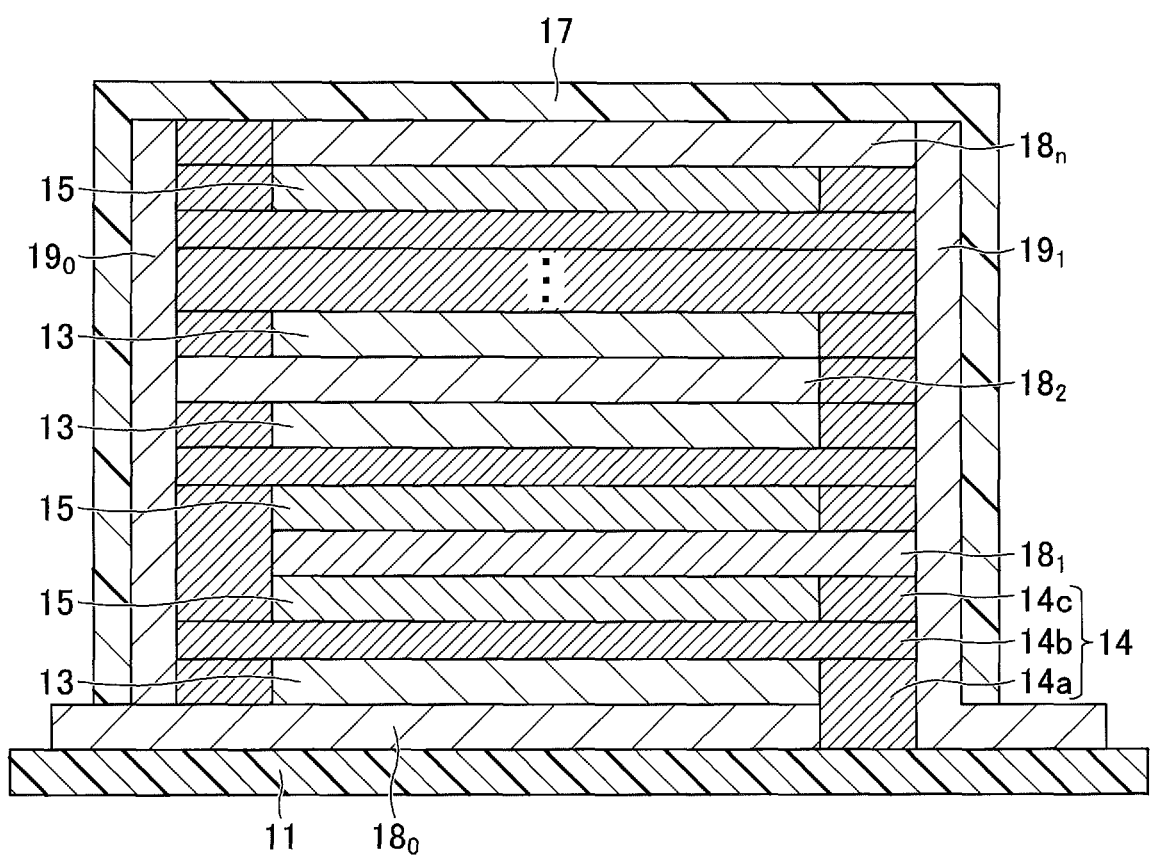
FIG. 8 is a diagram (part 1) illustrating a sealing layer in the case of a multilayer laminated structure according to an embodiment of the present embodiment.

As illustrated in FIG. 8, similarly with respect to a multilayer lamination structure, the sealing layer 17 is formed on the first electrically conductive layer $18_0$, the electrically conductive layer $19_0$, the n+1 electrically conductive layer $18_n$, and the electrically conductive layer $19_1$. At this time, portions of the first electrically conductive layer $18_0$ and the n+1 electrically conductive layer $18_n$ are exposed from the sealing layer 17 for electrical coupling to an external circuit.

Figure 9:
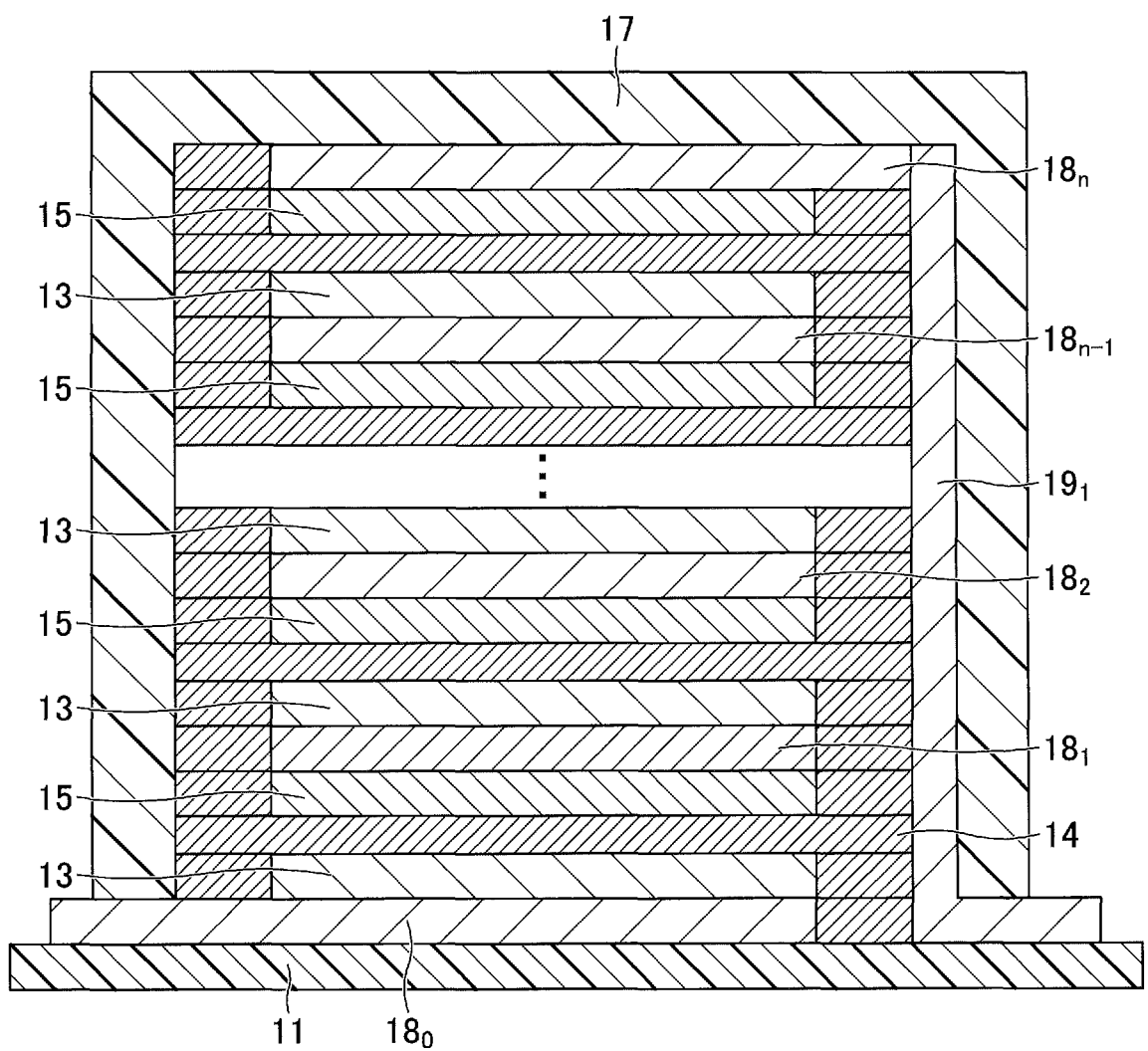
FIG. 9 is a diagram (part 2) illustrating a sealing layer in the case of a multilayer laminated structure according to an embodiment of the present embodiment.

In this way, a power storage element can be obtained, in which the upper and lower surfaces of each electrically conductive layer have a mixture layer having the same polarity (positive electrode or negative electrode), and the positive electrodes or the negative electrodes are coupled in parallel. Further, as illustrated in FIG. 9, similarly, it is possible to form a laminated structure in which the upper and lower surfaces of each electrically conductive layer have mixture layers of different polarities (positive electrode or negative electrode).

<Voltage Detecting Unit>
<<Configuration of Voltage Detecting Unit>>

Figure 10:
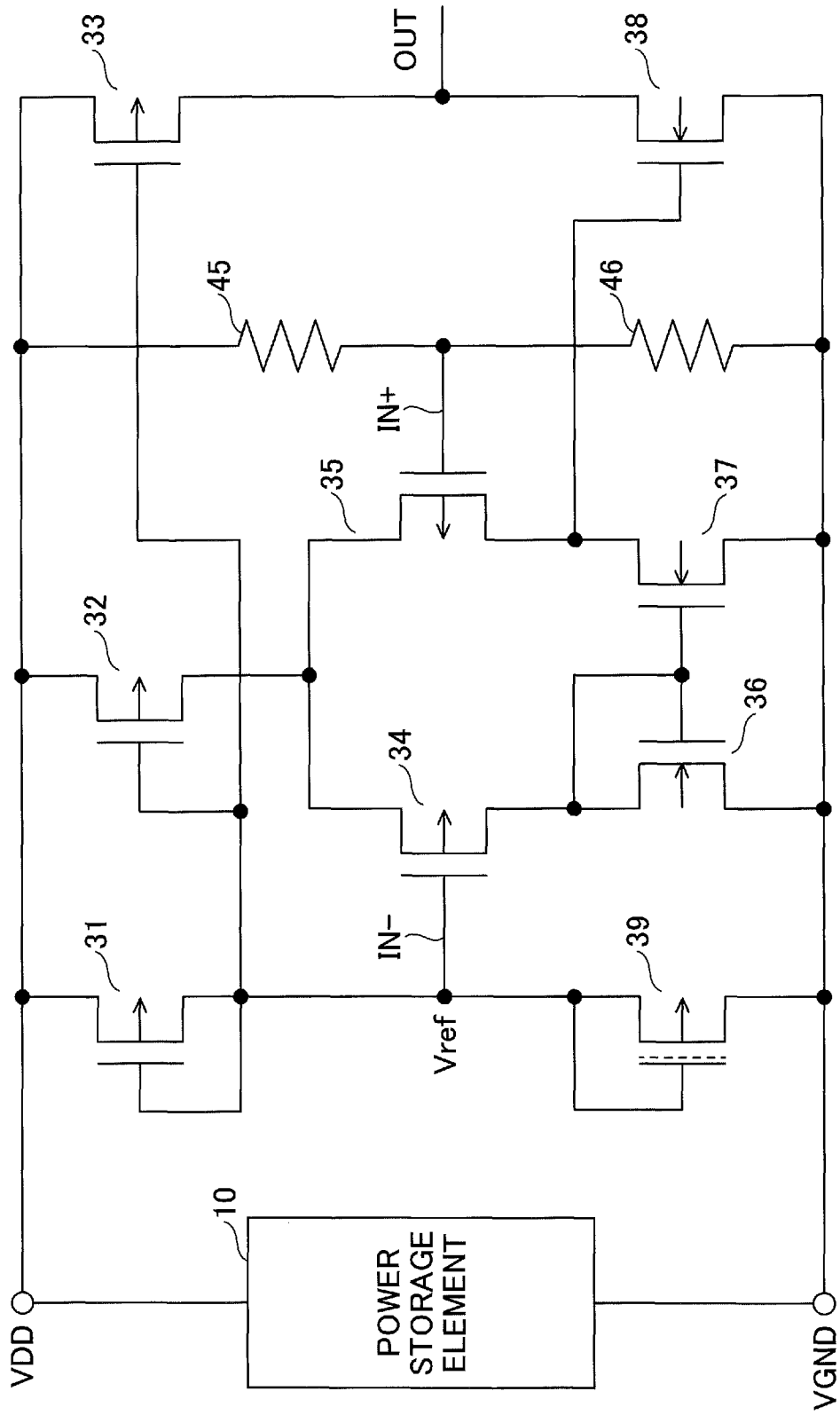
FIG. 10 is a diagram (part 1) illustrating an example of a circuit configuration of a voltage detecting unit according to an embodiment of the present embodiment.

FIG. 10 is a diagram illustrating an example of a circuit configuration of the voltage detecting unit. The voltage detecting unit illustrated in FIG. 10 includes transistors 31 to 38, a depletion transistor 39, and resistive elements 45 and 46. The transistors 31 to 38 and the depletion transistor 39 are field effect transistors.

The portion formed of the transistors 34 to 37 is an operational amplifier (op-amp) circuit. This op-amp circuit is described in detail, for example, in "Scientific Reports 8, Article number: 8980 (2018)", which is a non-patent document.

In the voltage detecting unit illustrated in FIG. 10, the depletion transistor 39 that operates as a constant current circuit is coupled to the input IN− of the op-amp circuit. To the transistor 31 coupled between VDD (output voltage of the power storage element 10) and the depletion transistor 39, the same current as in the depletion transistor 39 flows, and a constant current also flows to the transistors 32 and 33 that are current mirror circuits, so that the op-amp circuit is operable.

The constant current value can be controlled by controlling the transistor size and the threshold voltage of the depletion transistor 39, and the current flowing to the transistor 31 is constant, and, therefore, the gate voltage of the transistor 31 becomes a constant voltage. The transistor 31 is in a saturated connection, and, therefore, the gate voltage and the drain voltage of the transistor 31 operate as a constant voltage, i.e., a reference voltage Vref based on a VDD potential.

The reference voltage Vref is the difference between the threshold voltage of the transistor 31 and the threshold voltage of the depletion transistor 39. The depletion transistor 39 operates in a saturated region, and, therefore, the current flowing to the depletion transistor 39 hardly depends on VDD, and the reference voltage Vref becomes a stable potential.

It is possible to detect VDD, that is, the output voltage of the power storage element 10, by coupling the reference voltage Vref to one input IN− of the op-amp circuit and coupling the coupling point of the resistive element 45 and the resistive element 46, which are coupled between VDD and VGND (ground reference voltage), to the other input IN+ of the op-amp circuit.

Thus, the transistor 31 and the depletion transistor 39 are coupled in series between VDD and VGND, and a reference voltage Vref, which is used as a reference when detecting the output voltage VDD of the power storage element 10, is generated. The voltage detecting unit can detect that the output voltage of the power storage element 10 is outside a predetermined range, by using the reference voltage Vref.

That is, the voltage detecting unit generates the reference voltage Vref by the transistor 31 and the depletion transistor 39, divides the output voltage of the power storage element 10 by the resistive element 45 and the resistive element 46, inputs the divided output voltages to the input IN− and the input IN+ of the op-amp circuit, and performs voltage comparison. Accordingly, it is possible to detect that the output voltage of the power storage element 10 is outside the predetermined range.

Figure 11:
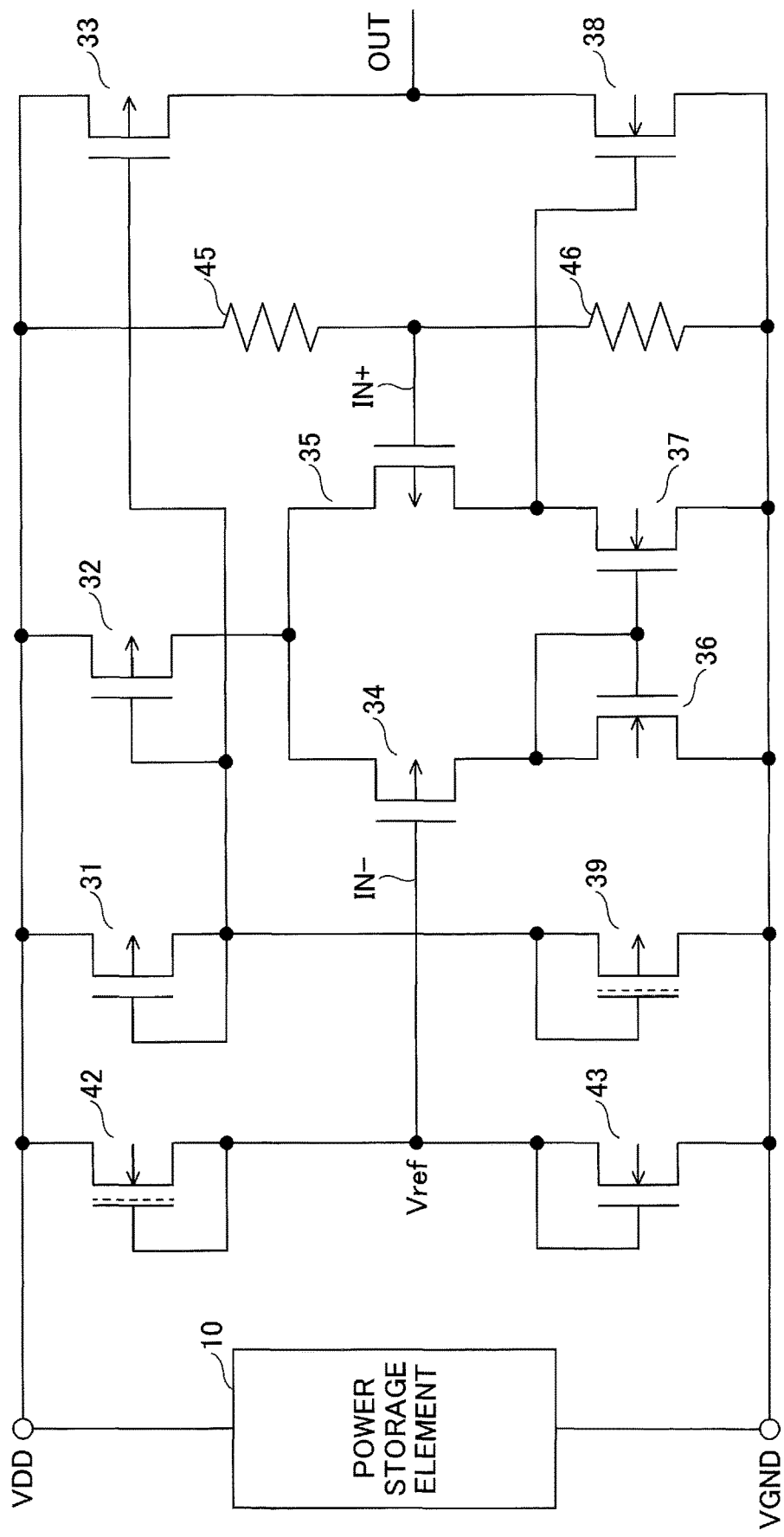
FIG. 11 is a diagram (part 2) illustrating an example of a circuit configuration of a voltage detecting unit according to an embodiment of the present embodiment.

In the circuit for generating the reference voltage Vref illustrated in FIG. 10, the transistor 31 and the depletion transistor 39 are configured with a Pch transistor; however, the transistor 31 and the depletion transistor 39 may be configured with an Nch transistor as illustrated in FIG. 11. In this case, the drain terminal of a Nch depletion transistor 42 is coupled to VDD, and the gate terminal and the source terminal are coupled. The source terminal of a Nch transistor 43 in saturated connection may be coupled to VGND, and the potential of the point at which the source terminal of the Nch depletion transistor 42 and the drain terminal of the Nch transistor 43 are coupled, may be the reference voltage Vref based on VGND.

By being formed by a coating process, the transistors 31 to 38, the depletion transistor 39, and the resistive elements 45 and 46 can be integrally formed on the same base material without any point bonding portions formed by solder mounting.

<<Formation of Thin Film Transistor Layers>>

The transistors 31 to 38 and the depletion transistor 39 can be formed by using, for example, organic transistors. Note that many techniques have been proposed for organic transistors, such as those detailed in Japanese Patent No. 5380831.

<Basic Structure of Organic Transistor>

Figure 12:
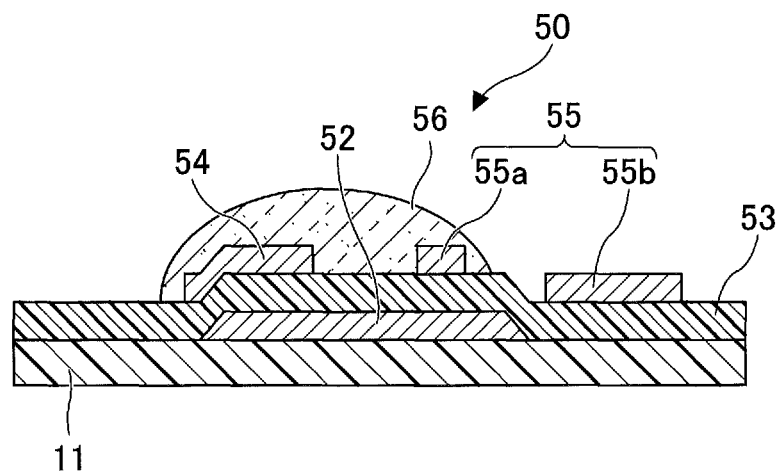
FIG. 12 is a cross-sectional view illustrating an example of the structure of an organic transistor according to an embodiment of the present embodiment.
Figure 13:
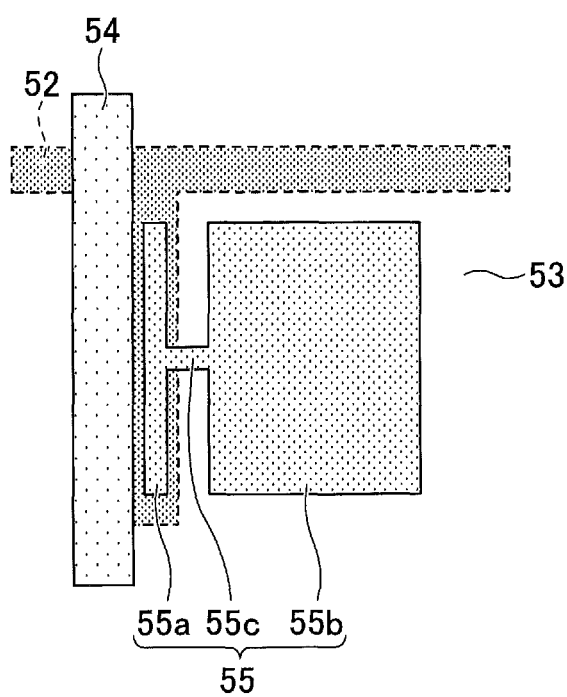
FIG. 13 is a plan view illustrating an example of the structure of an organic transistor according to an embodiment of the present embodiment.

FIG. 12 is a cross-sectional view illustrating an example of the structure of an organic transistor. FIG. 13 is a plan view illustrating an example of the structure of the organic transistor.

As illustrated in FIG. 12, an organic transistor 50 is formed by sequentially forming a gate electrode 52 and a gate insulating film 53 on the insulating base material 11, and sequentially forming a source electrode 54, a drain electrode 55, and an organic semiconductor layer 56 on the gate insulating film 53.

The drain electrode 55 includes a first region 55a and a second region 55b formed on the gate electrode 52, and a coupling unit 55c that couples the first region 55a and the second region 55b with a width shorter than the width (channel width) of the first region 55a. The organic semiconductor layer 56 is formed by a printing method such as inkjet printing, a dispenser method, and the like.

Figure 14:
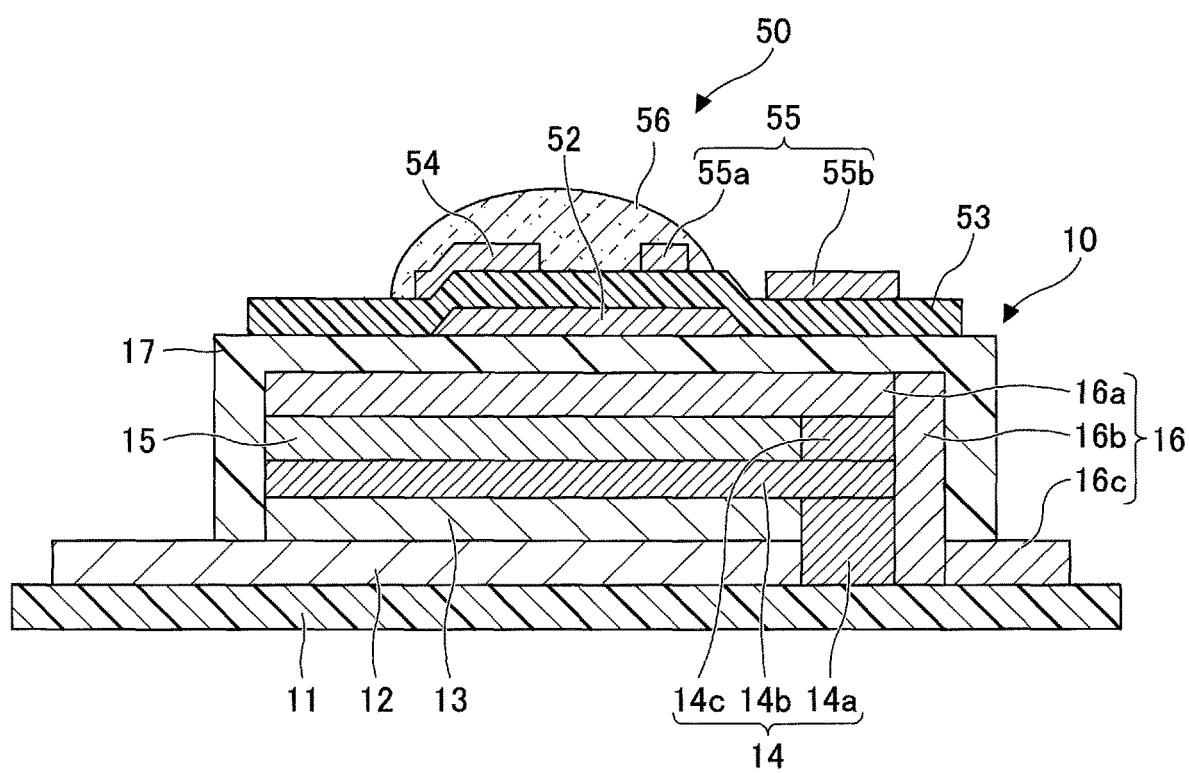
FIG. 14 is a cross-sectional view illustrating an example in which an organic transistor is formed on a power storage element according to an embodiment of the present embodiment.
Figure 15:
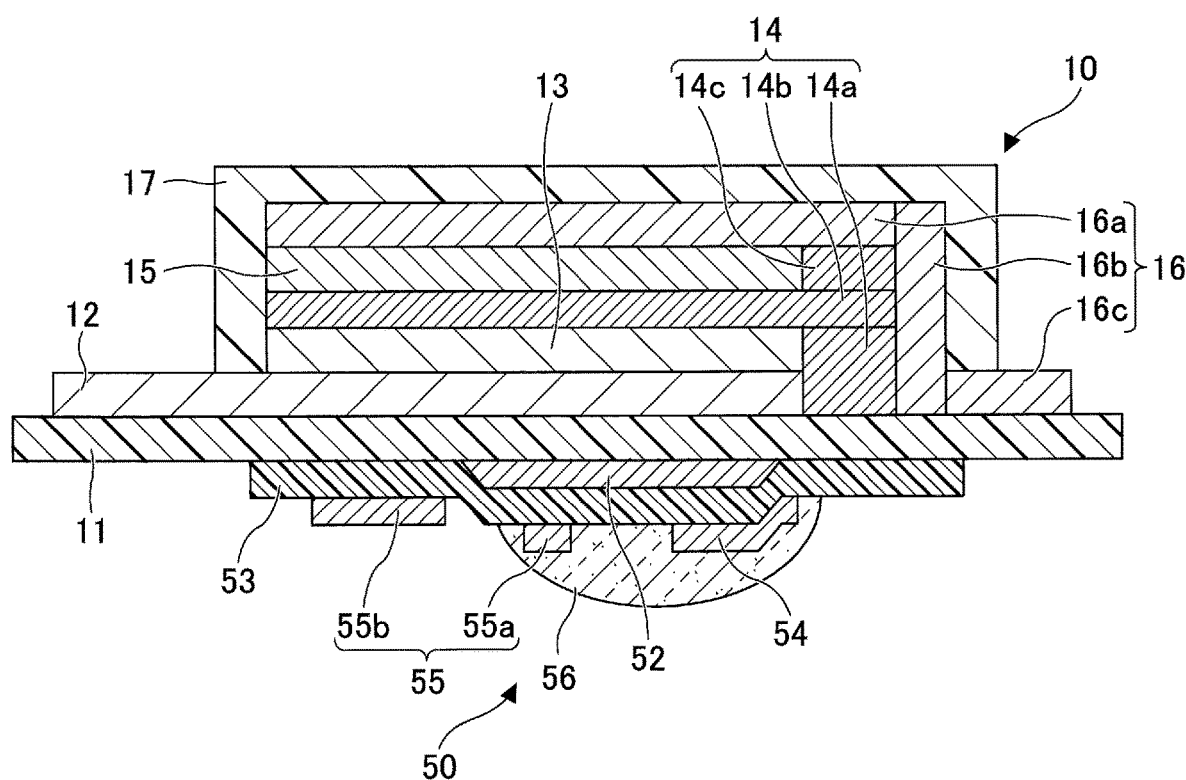
FIG. 15 is a cross-sectional view illustrating an example in which an organic transistor is formed under a power storage element according to an embodiment of the present embodiment.

Note that the organic transistor 50 may be formed in a region not overlapping the power storage element 10 on the insulating base material 11 in a planar view. However, as illustrated in FIG. 14, the organic transistor 50 may be formed on the power storage element 10, or as illustrated in FIG. 15, the organic transistor 50 may be formed on the opposite side of the power storage element 10 with the insulating base material 11 interposed between the organic transistor 50 and the power storage element 10.

That is, the voltage detecting unit may be formed on the power storage element 10, or may be formed on the insulating base material 11 on which the power storage element 10 is formed, on the side opposite to the side on which the power storage element 10 is formed. When the voltage detecting unit is formed on the power storage element 10, it is preferable that the minimum area of the area taken to include the entire structure of the voltage detecting unit, is smaller than the area of the upper surface of the power storage element 10.

<<Organic Semiconductor Layer>>

Preferably, the organic semiconductor layer 56 is patterned using organic semiconductor ink obtained by dissolving an organic semiconductor material in an organic solvent. Examples of the organic semiconductor material soluble in the organic solvent include, but are not limited to, polymeric materials, oligomeric materials, small molecular materials, and the like. Examples include organic small molecules such as pentacene, anthracene, tetracene, phthalocyanine and the like; polyacetylene-based conductive polymers; polyphenylene-based conductive polymers such as polypropylene and derivatives thereof, polyphenylene vinylene and derivatives thereof; heterocyclic conductive polymers such as polypyrrole and derivatives thereof, polythiophene and derivatives thereof, polyfuran and derivatives thereof and the like; and ionic conductive polymers such as polyaniline and derivatives thereof.

<<Depletion Transistor>>

As a method of injecting the carriers into the channel layer, a method of forming an insulator surface having a polarity at the interface of the gate dielectric film and the organic semiconductor, can be used. For example, by using a self-assembled membrane (SAM) having a polarity, the carriers can be increased even when the gate voltage is not applied, so that the threshold voltage of the transistor can be shifted, and the depletion transistor can be formed. As a self-assembled membrane with such a polarity, fluorinated decyltrichlorosilane and dimethylaminopropyltriethoxysilane can be used. As for the method of injecting the carriers into the channel layer, for example, details are given in "S. Kobayashi et. al, Nature Mater, 3, 317 (2004)" which is a non-patent document.

<<Formation of Gate Electrode, Source Electrode, and Drain Electrode>>

The gate electrode 52, the source electrode 54, and the drain electrode 55 can be patterned by a printing method such as inkjet printing, a dispenser method, and the like. In this case, it is preferable to use a metal ink containing metal particles or metal complexes. Examples of metal particles include, but are not particularly limited to, Au, Ag, Cu, Pt, Pd, Ni, Ir, Rh, Co, Fe, Mn, Cr, Zn, Mo, W, Ru, In, Sn, and the like, and two or more kinds may be used in combination.

Further, a dispersion liquid of a conductive polymer and the like may be used. Examples of conductive polymers include polythiophene, polyaniline, polypyrrole, polyparaphenylene, polyacetylene, or materials doped with these polymers, and the like. Among these, a complex (PEDOT/PSS) of polyethylene dioxythiophene (PEDOT) and polystyrene sulfonic acid (PSS) is preferable in terms of electrical conductivity, stability, heat resistance, and the like.

<<Gate Insulating Film>>

The gate insulating film 53 may be formed, for example, by applying a solution of a predetermined material by spin-coating and firing the applied material. The gate insulating film 53 may be formed by inkjet printing. Examples of materials forming the gate insulating film 53 include polymeric materials such as parylene, polyimide, polyparaxylene, polyvinylphenol, polyester, acrylic resin such as polyacrylonitrile, polymethyl methacrylate, epoxy resin, thermosetting resin, and the like.

<<Formation of Sealing Layer>>

As the sealing layer 17, parylene, polyimide, and siloxane can be used in the same manner as the power storage element 10. Further, a fine oxide film, a nitride film, and an oxynitride film, such as a hafnium oxide ($HfO_x$), a zirconium oxide ($ZrO_x$), a silicon oxide ($SiO_x$), a silicon nitride (SiN), a silicon oxide nitride (SiON), an aluminum oxide ($AlO_x$), and the like, can be used, by a chemical vapor deposition method or an atomic layer deposition method.

The sealing layer 17 can be formed, for example, by inkjet printing collectively after the power storage element 10, the monitoring unit 20, and the switch units 30A and 30B are formed.

<<Resistive Element>>

The resistive elements 45 and 46 of FIGS. 10 and 11 may be formed by printing two electrodes facing each other, and forming, for example, a conductive polymer film or a conductive film including carbon material and binder between the electrodes, thereby forming a resistive element. As the electrode material, it is preferable to use a metal ink containing metal particles or metal complexes.

Examples of metal particles include, but are not particularly limited to, Au, Ag, Cu, Pt, Pd, Ni, Ir, Rh, Co, Fe, Mn, Cr, Zn, Mo, W, Ru, In, Sn, and the like, and two or more kinds may be used in combination.

Examples of conductive polymers used in the conductive film include polythiophene, polyaniline, polypyrrole, polyparaphenylene, polyacetylene, or materials doped with these polymers, and the like. Among these, a complex (PEDOT/PSS) of polyethylene dioxythiophene (PEDOT) and polystyrene sulfonic acid (PSS) is preferable in terms of stability, heat resistance, and the like.

The smaller the cross-sectional area that is perpendicular to the direction of the current flowing between the two electrodes, or the longer the distance between the two electrodes, the higher the resistance. By controlling the dimensions of the conductive film, the resistance value can be controlled in a range from 1 kΩ or more and 100 MΩ or less. Preferably, the resistance value is 10 kΩ or more and 10 MΩ or less.

Note that the switch units 30A and 30B can be formed, for example, using field effect transistors, and field effect transistors can be controlled, for example, by a two input AND circuit coupled to the gate. In this case, the output voltage of the power storage element 10 is input to one of the inputs of the AND circuit, and the ON/OFF of the switch units 30A and 30B can be controlled by the H/L of the other input.

Components of the AND circuit can be formed by a printing technique. With regard to this printing technique, for example, details are provided in "K. Hayasaka et al., Adv. Electron. Mater, 1700208 (2017)", which is a non-patent document.

As described above, the voltage detecting unit 21, the switch unit 30A, and the switch unit 30B as well as the power storage element 10 can be integrally formed on the same insulating base material 11 by a coating process. As a result, a power storage system tailored to the shape of an IoT edge device can be provided.

That is, only by changing the design data, it is possible to provide a power storage system that maximally utilizes the limited space for IoT edge devices of different designs, and, therefore, it is possible to flexibly design a power storage system of the necessary size for the design of the IoT edge device.

Further, by using the same coating process, when the variety is switched, it is not necessary to change the manufacturing process, and, therefore, it is possible to produce a wide variety of products with very high efficiency.

Further, the power storage element and the circuit attached thereto are directly printed onto the same insulating base material, and, therefore, a mounting process is not required. Therefore, it is possible to eliminate the impact of damage by heat on the power storage element and the insulating base material.

According to one embodiment of the present invention, a power storage system having a high degree of design freedom can be provided.

The power storage system and the manufacturing method of the power storage system are not limited to the specific embodiments described in the detailed description, and variations and modifications may be made without departing from the spirit and scope of the present invention.

What is claimed is:

1. A power storage system comprising:
a power storage element that includes
a first electrode mixture layer,
a first conductive layer that contacts the first electrode mixture layer,
a second electrode mixture layer, and
a second conductive layer that contacts the second electrode mixture layer;
a non-aqueous electrolyte layer; and
a voltage detecting unit configured to detect an output voltage of the power storage element, wherein
the power storage element and the voltage detecting unit are formed by integrally forming structural materials of the power storage element and the voltage detecting unit on a same base material, without any point bonding portions formed by solder mounting,
the first electrode mixture layer and the second electrode mixture layer are stacked in a vertical direction with respect to the plane of the base material,
the non-aqueous electrolyte layer includes
a first portion that is disposed along at least a part of a peripheral edge of the first electrode mixture layer, the first portion contacting the base material, the first conductive layer, and the second conductive layer; and
a second portion that is disposed along at least a part of a peripheral edge of the second electrode mixture layer,
the second conductive layer contacts the first portion and the second portion of the non-aqueous electrolyte layer on an opposite side of the non-aqueous electrolyte layer from the peripheral edges of the first electrode mixture layer and the second electrode mixture layer, and
at least one of the first electrode mixture layer or the second electrode mixture layer is formed of a plurality of layers so that the power storage element has a multilayer laminate structure.

2. A power storage system comprising:
a power storage element; and
a voltage detecting unit configured to detect an output voltage of the power storage element, wherein
the power storage element is a non-aqueous electrolyte secondary battery,
the non-aqueous electrolyte secondary battery has a laminated structure including:
a first electrically conductive layer formed on a base material;
a first electrode mixture layer formed on the first electrically conductive layer;
a non-aqueous electrolyte layer formed on the first electrode mixture layer;
a second electrode mixture layer formed on the non-aqueous electrolyte layer; and
a second electrically conductive layer formed on the second electrode mixture layer,
the laminated structure is covered by a sealing layer,
the voltage detecting unit includes:
a resistive element; and
a field effect transistor,
the resistive element and the field effect transistor are integrally formed on the base material, without any point bonding portions formed by solder mounting,
the first electrode mixture layer and the second electrode mixture layer are stacked in a vertical direction with respect to the plane of the base material,
the non-aqueous electrolyte layer includes
a first portion that is disposed along at least a part of a peripheral edge of the first electrode mixture layer, the first portion contacting the base material, and the first electrically conductive layer; and
a second portion that is disposed along at least a part of a peripheral edge of the second electrode mixture layer,
the second electrically conductive layer contacts the first portion and the second portion of the non-aqueous electrolyte layer on an opposite side of the non-aqueous electrolyte layer from the peripheral edges of the first electrode mixture layer and the second electrode mixture layer, and
at least one of the first electrode mixture layer or the second electrode mixture layer is formed of a plurality of layers so that the power storage element has a multilayer laminate structure.

3. The power storage system according to claim 2, wherein
a lamination portion of the first electrically conductive layer and the first electrode mixture layer and a lamination portion of the second electrode mixture layer and the second electrically conductive layer are disposed to face each other with a predetermined space maintained between the lamination portions and with the non-aqueous electrolyte layer interposed between the lamination portions.

4. The power storage system according to claim 2, wherein
the field effect transistor includes a first field effect transistor and a second field effect transistor, wherein
the first field effect transistor and the second field effect transistor are coupled in series between the output voltage of the power storage element and a ground reference voltage, and
the first field effect transistor and the second field effect transistor generate a reference voltage to be used as a reference when detecting the output voltage of the power storage element.

5. The power storage system according to claim 4, wherein the voltage detecting unit detects that the output voltage of the power storage element is outside a predetermined range by using the reference voltage.

6. The power storage system according to claim 1, wherein
the voltage detecting unit is formed on the power storage element,
the power storage element including an upper surface disposed on an opposite side of the power storage element facing away from the base material, and
a projection area of the voltage detecting unit projected on the upper surface of the power storage element is smaller than an area of the upper surface of the power storage element.

7. The power storage system according to claim 1, wherein the voltage detecting unit and the power storage element are formed on opposite sides of the base material.

8. A method of manufacturing a power storage system, the power storage system including:
a power storage element that includes
a first electrode mixture layer,
a first conductive layer that contacts the first electrode mixture layer,
a second electrode mixture layer, and
a second conductive layer that contacts the second electrode mixture layer;
a non-aqueous electrolyte layer; and
a voltage detecting unit configured to detect an output voltage of the power storage element, the method comprising:
forming the power storage element and the voltage detecting unit by integrally forming structural materials of the power storage element and the voltage detecting unit, by a coating process, on a same base material, without any point bonding portions formed by solder mounting,
stacking the first electrode mixture layer and the second electrode mixture layer in a vertical direction with respect to the plane of the base material, and
disposing
a first portion of the non-aqueous electrolyte layer along at least a part of a peripheral edge of the first electrode mixture layer, the first portion contacting the base material, and the first electrically conductive layer; and
a second portion of the non-aqueous electrolyte layer along at least a part of a peripheral edge of the second electrode mixture layer, wherein
the second electrically conductive layer contacts the first portion and the second portion of the non-aqueous electrolyte layer on an opposite side of the non-aqueous electrolyte layer from the peripheral edges of the first electrode mixture layer and the second electrode mixture layer, and
at least one of the first electrode mixture layer or the second electrode mixture layer is formed of a plurality of layers so that the power storage element has a multilayer laminate structure.

9. The power storage system according to claim 1, wherein the voltage detecting unit further includes an organic semiconductor layer.

10. The power storage system according to claim 1, wherein the base material has a planar shape.

11. The power storage system according to claim 10, wherein
a first mixture layer is provided on one side of the first electrically conductive layer,
a second mixture layer provided on an opposite side of the first electrically conductive layer from the first mixture layer, and
the first mixture layer has a polarity that is the same as the polarity of the second mixture layer.

12. The power storage system according to claim 10, wherein
a first mixture layer is provided on one side of the first electrically conductive layer,
a second mixture layer provided on an opposite side of the first electrically conductive layer from the first mixture layer, and
the first mixture layer has a polarity that is different from the polarity of the second mixture layer.

13. The method of manufacturing a power storage system according to claim 8, the method further comprising:
forming the voltage detecting unit by:
coating a base material with structural materials to form a gate electrode and a gate insulating film on the base material, and
coating the gate insulating film with structural materials to form a source electrode, a drain electrode, and an organic semiconductor layer on the gate insulating film.

14. The method of manufacturing a power storage system according to claim 8, wherein the coating process is an inkjet printing process.

15. The power storage system according to claim 1, wherein
the outer periphery of the of at least one of the first electrode mixture layer or the second electrode mixture layer is the outer periphery in a plane that is parallel with the plane of the base material.

16. The power storage system according to claim 1, wherein
the non-aqueous electrolyte layer is disposed along at least on part of the outer periphery of both the first electrode mixture layer and the second electrode mixture layer.

17. The power storage system according to claim 2, wherein the non-aqueous electrolyte layer is disposed along at least on part of an outer periphery of at least one of the first electrically conductive layer or the second electrically conductive layer.

18. The power storage system according to claim 17, wherein the non-aqueous electrolyte layer is disposed along at least on part of the outer periphery of both the first electrically conductive layer or the second electrically conductive layer.

19. The power storage system according to claim 1, wherein the non-aqueous electrolyte layer is also provided between the first electrode mixture layer and the second electrode mixture layer.

\* \* \* \* \*